United States Patent [19]
Mori et al.

[11] Patent Number: 5,714,895
[45] Date of Patent: Feb. 3, 1998

[54] MEAN VALUE DETECTING APPARATUS AND MEAN VALUE DETECTING INTEGRATED CIRCUIT HAVING AN OFFSET VOLTAGE ADJUSTING CIRCUIT

[75] Inventors: Kazuyuki Mori, Kawasaki; Yoshihisa Kondo, Oyama, both of Japan

[73] Assignee: Fujitsu Limited, Kanagawa, Japan

[21] Appl. No.: 521,689

[22] Filed: Aug. 31, 1995

[30]  Foreign Application Priority Data

Nov. 1, 1994 [JP] Japan .................. 6-268586

[51] Int. Cl.⁶ ............................................ H03D 11/00
[52] U.S. Cl. .................... 327/104; 327/307; 327/344
[58] Field of Search .......................... 327/104, 336, 327/344, 307; 363/88, 89, 123, 124, 125, 126, 127, 128; 330/9

[56]  References Cited

U.S. PATENT DOCUMENTS 4,578,646  3/1986  Maio et al. ........................ 327/307
4,733,404  3/1988  Ostoich ............................. 327/336
4,866,396  9/1989  Tamura ............................. 327/104

FOREIGN PATENT DOCUMENTS 5227104  9/1993  Japan .

Primary Examiner—Timothy P. Callahan
Assistant Examiner—Kenneth B. Wells
Attorney, Agent, or Firm—Helfgott & Karas, P.C.

[57]  ABSTRACT

Herein disclosed are a mean value detecting apparatus and a mean value detecting integrated circuit, having a mean value detecting unit formed with a resistance and a capacitance for detecting a mean value of an input signal, and an offset voltage adjusting unit connected in parallel to the mean value detecting unit at a connecting point of the resistance and a capacitance of the mean value detecting unit. With the above arrangement, this invention allows a large reduction of a size of the circuit.

29 Claims, 23 Drawing Sheets

FIG. I

F I G. 22
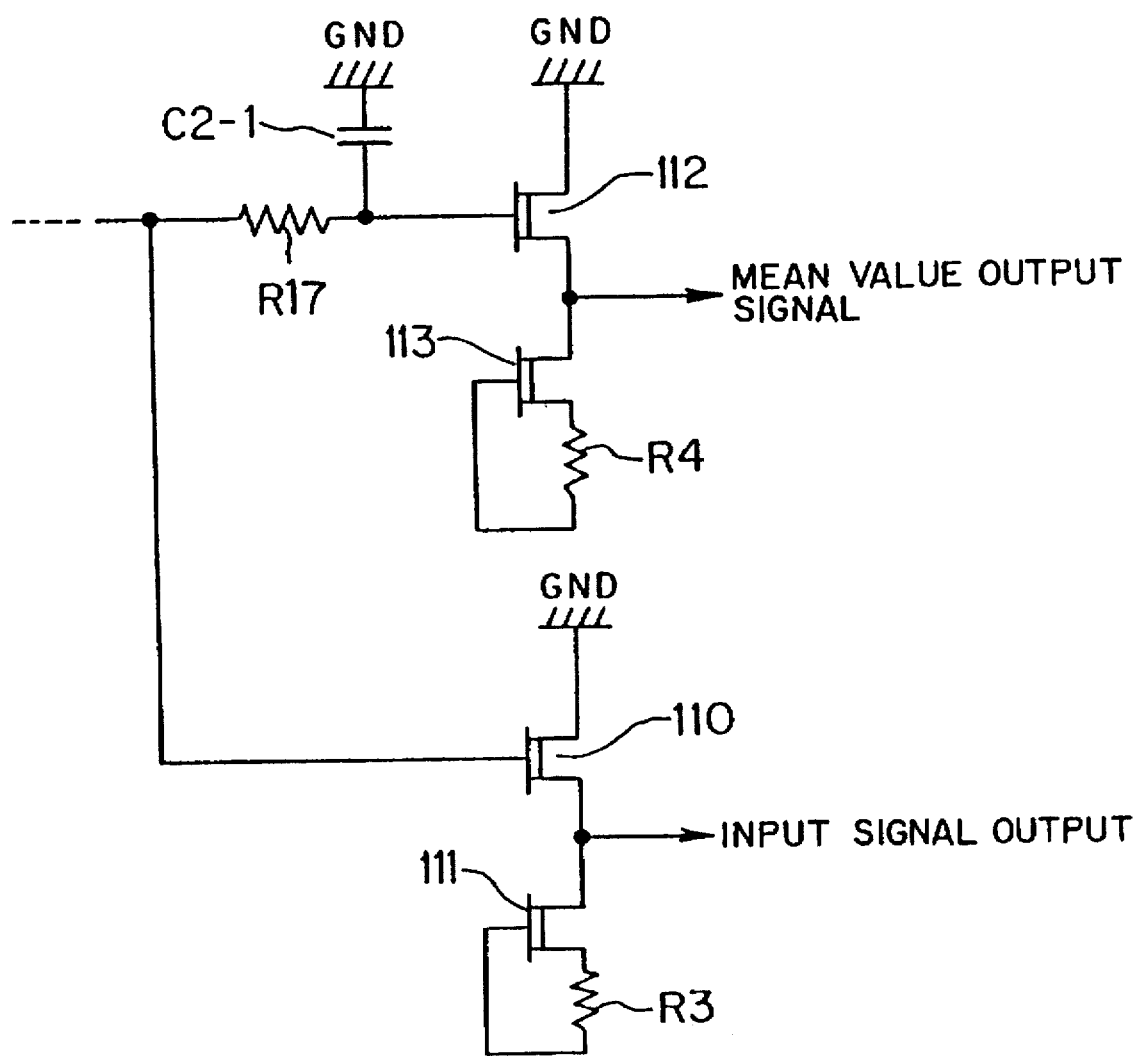

MEAN VALUE DETECTING APPARATUS AND MEAN VALUE DETECTING INTEGRATED CIRCUIT HAVING AN OFFSET VOLTAGE ADJUSTING CIRCUIT

BACKGROUND OF THE INVENTION (1) Field of the Invention

The present invention relates to a mean value detecting apparatus and a mean value detecting integrated circuit.

(2) Description of the Related Art

FIG. 23 is a diagram showing a structure of a general mean value detecting apparatus. In FIG. 23, reference numerals 401 through 404 denote FETs, 405 denotes an offset adjusting circuit, 407 denotes a terminal, R400 and C400 denote a resistor and a capacitor for detecting a mean value, respectively. Incidentally, reference numeral 408 denotes a connecting point of the resistor R400 and the capacitor C400, VDD denotes a positive electric source and VSS denotes a negative electric source.

In the mean value detecting apparatus with the above arrangement, the FET 401 which is a normally-off type provides half of the input signal as an output, while detecting a mean value (a center voltage of the signal wave) of the other half by the resistor R400 and the capacitor C400 and outputting it.

When the resistor R400 and the capacitor C400 detect a mean value of the input signal, a current IL called a leak current flows through the FET 402. This leak current causes a potential difference (an offset) by $\Delta V = IL \times R400$ at the resistor R400. For this, the potential obtained in the mean value detection is outputted while it deviates by $\Delta V$ from its center voltage. This not only makes it difficult to obtain an accurate mean value, but also occasionally causes an false operation of a apparatus in the following stage into which an output from this mean value detecting apparatus is inputted.

To avoid this, the offset adjusting circuit 405 is heretofore connected in series to the connecting point 408 of the resistor R400 and the capacitor C400. The offset adjusting circuit 405 has been adjusted via the terminal 407 to adjust a current flowing through the resistor R400.

However, such mean value detecting apparatus has a capacitance (the capacitor C400) therein. If such mean value detecting apparatus is integrated, the capacitance has to be provided within the integrated circuit, which causes an increase in the area of the integrated circuit.

Moreover, if a capacitance is provided within an integrated circuit as in the above case, a time constant of the mean value detecting apparatus is limited since a large capacitance cannot be provided within the integrated circuit.

The capacitance is possibly provided within the integrated circuit as a solution of the above problem. In which case, it is necessary to provide the connecting terminal 406 used to connect the capacitor C400 to the outside of the integrated circuit separately from the adjusting terminal 407 for the offset adjusting circuit 405, as shown in FIG. 23. In addition, wirings for these terminals are necessary. In the case of an integrated circuit in which plural mean value detecting apparatus mentioned above are arrayed, a channel in the central portion is prone to be affected by another channel since a signal wiring of the another channel and wirings for the offset adjusting circuit 405 and the capacitor (the capacitance) C400 intersect in the central portion.

Further, since two wirings for the capacitor C400 and the offset adjusting circuit 405 are necessary for one channel, the chip area of the integrated circuit increases, which leads to an increase of a cost of the integrated circuit.

Hereinafter, a manner of the offset adjustment performed in the general circuit shown in FIG. 23 will be further described.

In this circuit, an input signal applied to the gate of the FET 401 which is output from the source of the FET 401, whereas the input signal is also applied to the gate of the FET 402 through the resistor R400, capacitor C400 and Offset Adjusting Circuit 405, and outputted from the source of the FET 402. The output from the source of the FET 402 has mean value information of the input signal. Such operation is based on a case that the input signal is alternating-current, but a source voltage of the FET 401 becomes equal to a source voltage of the FET 402 if the input signal is direct-current and the FETs are the same. However, the gate voltage of the FET 402 varies, according to a current IL flowing between the drain and the gate of the FET 402 and the resistor R400 so that respective source voltages of the FETs 401 and 402 are different (in other words, a source voltage of the FET 402 is higher than a source voltage of the FET 401). In this manner, a potential difference is generated between the source voltages of the FETs 401 and 402. The offset adjusting circuit 405 connected to the gate of the FET 402 removes this potential difference. This is the manner of the offset adjustment performed in the circuit shown in FIG. 23.

The offset adjusting circuit removes the above described potential difference. The potential difference $IL \times R400$ is generated between the gate (to which the input signal is applied) of FET 401 and the gate of FET 402 due to IL (leakage current) of FET 402 being applied to R400. The potential difference between the gate of FET 401 and the gate of FET 402 causes a potential difference to be generated between the source follower output of FET 401 (the source of FET 401) and the mean value output which is a source follower output of FET 402 (the source of FET 402).

By applying a predetermined voltage which is equal to $IL \times R400$ to the terminal 407 of the offset adjusting circuit 405, the gate voltage of FET 402 becomes equal to the gate voltage of FET 401, thereby cancelling the potential difference $IL \times R400$. By cancelling the potential difference between the gate of FET 401 and the gate FET 402, the source follower output becomes equal to the voltage (direct current voltage) of the means value output.

SUMMARY OF THE INVENTION

To solve the above problems, an object of this invention is to provide a mean value detecting apparatus in which an offset adjusting circuit is connected in parallel to a mean value detecting circuit which detects a mean value of an input signal at a connecting point of a resistance and a capacitance of the mean value detecting circuit so as to decrease a size of the circuit to a large extent.

Another object of this invention is to provide a mean value detecting circuit in which a capacitance for detecting a mean value and an offset adjusting circuit are provided outside the integrated circuit so as to minimize a size of a circuit of the integrated circuit.

Still another object of this invention is to provide a mean value detecting apparatus which uses a leak current generated in a mean value detecting circuit as a feedback signal to cancel a potential difference (an offset) occurring due to the leak current in the mean value detecting circuit, thereby accurately detecting a mean value of an input signal.

This invention therefore provides a mean value detecting apparatus comprising a mean value detecting unit having a resistance and a capacitance in order to detect a mean value of an input signal from said input signal, and an offset voltage adjusting unit connected in parallel to said mean value detecting unit at a connecting point between said resistance and said capacitance in said mean value detecting unit.

According to the mean value detecting apparatus of this invention, it is unnecessary to additionally provide individual terminals or wirings for the capacitance and the offset voltage adjusting unit, respectively. This invention therefore may accomplish a mean value detecting apparatus for adjusting an offset generating in the vicinity of the mean value detecting unit with a simpler structure and minimize a size of a circuit of the mean value detecting apparatus.

This invention also provides a mean value detecting integrated circuit comprising circuit units for plural channels, each of said circuit units comprising a front stage circuit for performing a necessary process on an input signal, a resistance which is an element constituting a mean value detecting unit that should be formed with said resistor and a capacitance in order to detect a mean value of an output of said front-stage circuit from said output, a rear stage circuit for performing a necessary process on a mean value output signal from said mean value detecting unit, and a strip line is formed in a direction intersecting an input-output direction of each of said circuit units, said capacitance as an element constituting said mean value detecting unit and a connecting terminal for an offset voltage generating unit being provided at an end of said strip line.

According to the mean value detecting apparatus of this invention, it is possible to connect the capacitance and the offset adjusting unit which are elements constituting the mean value detecting unit to a connecting terminal therefor to dispose them outside the integrated circuit. This invention therefore may largely reduce a size of a circuit of the mean value detecting integrated circuit.

This invention also provides a mean value detecting apparatus comprising a mean value detecting circuit comprising a mean value detecting unit formed with a resistance and a capacitance for detecting a mean value of an input signal, a first source follower circuit using a first FET, a second source follower circuit using a second FET, a monitor circuit for cancelling a potential difference generated due to a leak current from said second FET of said second source follower circuit, said monitor circuit comprising a bias circuit, a mean value detecting circuit for monitoring for receiving an output from said bias circuit as an input signal, having the same structure as said mean value detecting circuit, a comparing circuit of a direct-current amplifier type for comparing an input signal with an output signal of said mean value detecting circuit for monitoring to feed back deviation information as a feedback signal to said mean value detecting circuit for monitoring, and a control circuit for controlling a source follower current of said second source follower circuit by using the deviation information as the feedback signal of said monitor circuit.

According to the mean value detecting apparatus of this invention, it is possible to suppress an error in the mean value detection by the mean value detecting circuit caused from a potential difference generating due to a leak current from the second FET in the second source follower circuit. This invention therefore may largely improve a performance of the mean value detecting apparatus.

This invention also provides a mean value detecting apparatus comprising a pre-circuit for performing a necessary process on an input signal, a mean value detecting circuit comprising a mean value detecting unit formed with a resistance and a capacitance for detecting a mean value of an output of said pre-circuit, a first source follower circuit using a first FET, a second source follower circuit using a second FET, a differential amplifier circuit for receiving an output of said pre-circuit and an output of said mean value detecting circuit as differential inputs, a monitor circuit for cancelling a potential difference generated due to a leak current from said second FET of said second source follower circuit in said mean value detecting circuit, said monitor circuit comprising a bias circuit, a mean value detecting circuit for monitoring for receiving an output of said bias circuit as an input signal, having the same structure as said mean value detecting circuit, a comparing circuit of a direct-current amplifier type for comparing an input signal and an output signal of said mean value detecting circuit for monitoring to feed back deviation information as a feedback signal to said mean value detecting circuit for monitoring, and a control circuit for controlling a source follower current of said second source follower circuit by using said deviation information as the feedback signal of said monitor circuit to cancel a potential difference generating due to said leak current at an input point of said differential amplifier circuit.

According to the mean value detecting apparatus of this invention, it is possible to accomplish this mean value detecting apparatus with practical circuits quite readily. It is also possible in this case to suppress an error in the mean value detection by the mean value detecting circuit caused from a potential difference due to a leak current from the second FET in the second source follower circuit. This invention therefore may largely improve a performance of the mean value detecting apparatus.

This invention also provides a mean value detecting apparatus comprising circuit units for plural channels, each of said circuit units comprising a pre-circuit circuit for performing a necessary process on an input signal, a mean value detecting circuit comprising, a mean value detecting unit formed with a resistance and a capacitance for detecting a mean value of an output of said pre-circuit, a first source follower circuit using a first FET, a second source follower circuit using a second FET, a differential amplifier circuit for receiving an output of said pre-circuit and an output of said mean value detecting circuit as differential inputs, a common monitor circuit for cancelling a potential difference generated due to a leak current from said second FET of said second source follower circuit in said mean value detecting circuit, said common monitor circuit comprising a bias circuit, a mean value detecting circuit for monitoring for receiving an output from said bias circuit as an input signal, having the same structure as said mean value detecting circuit, a comparing circuit of a direct-current amplifier type for comparing an input signal and an output signal of said mean value detecting circuit for monitoring to feed back deviation information as a feedback signal to said mean value detecting circuit for monitoring, and control circuits provided for said plural channels, each of said control circuits or controlling a source follower current of said second source follower circuit by using the deviation information as the feedback signal of said common monitor circuit to cancel a potential difference generating due to said leak current at an input point of each of said differential amplifier circuits.

According to the mean value detecting apparatus of this invention, it is possible to accomplish the mean value detecting apparatus which may treat plural input signals with practical circuits quite readily, and suppress an error in the mean value detection by the mean value detecting circuit caused from a potential difference due to a leak current from the second FET in the second source follower circuit. This invention therefore may largely improve a performance of the mean value detecting apparatus. In addition, the monitor circuit is used in common to plural channels so that a size of a circuit of the above mean value detecting apparatus may be largely reduced.

This invention also provides a mean value detecting apparatus comprising a mean value detecting circuit comprising a mean value detecting unit formed with a resistance and a capacitance for detecting a mean value of an input signal, an offset voltage adjusting unit connected in parallel to said mean value detecting unit at a connecting point of said resistance and said capacitance in said mean value detecting unit, a first source follower circuit using a first FET, a second source follower circuit using a second FET, a monitor circuit for cancelling a potential difference generated due to a leak current from said second FET in said second source follower circuit, said monitor circuit comprising a bias circuit, a mean value detecting circuit for monitoring for receiving an output from said bias circuit as an input signal, said mean value detecting circuit for monitoring having the same structure of said mean value detecting circuit, a comparing circuit of a direct-current amplifier type for comparing an input signal and an output signal of said mean value detecting circuit for monitoring to feed back deviation information as a feedback signal to said mean value detecting circuit for monitoring, and a control circuit for controlling a source follower current of said second source follower circuit by using the deviation information as the feedback signal of said monitor circuit.

According to the mean value detecting apparatus, it is possible to suppress an error in the mean value detection by the mean value detecting circuit caused from a potential difference due to a leak current from the second FET in the second source follower circuit. The offset voltage adjusting unit may further reduce the error. This therefore allows an improvement of a performance of the mean value detecting apparatus to a further extent.

BRIEF DESCRIPTION OF THE DRAWINGS

FIG. 22 is a diagram showing another structure of the mean value detecting apparatus according to this invention.

DESCRIPTION OF THE PREFERRED EMBODIMENT (a) Description of Aspects of the Invention Hereinafter, description will be made of aspects of this invention with reference to the drawings.

Figure 1:
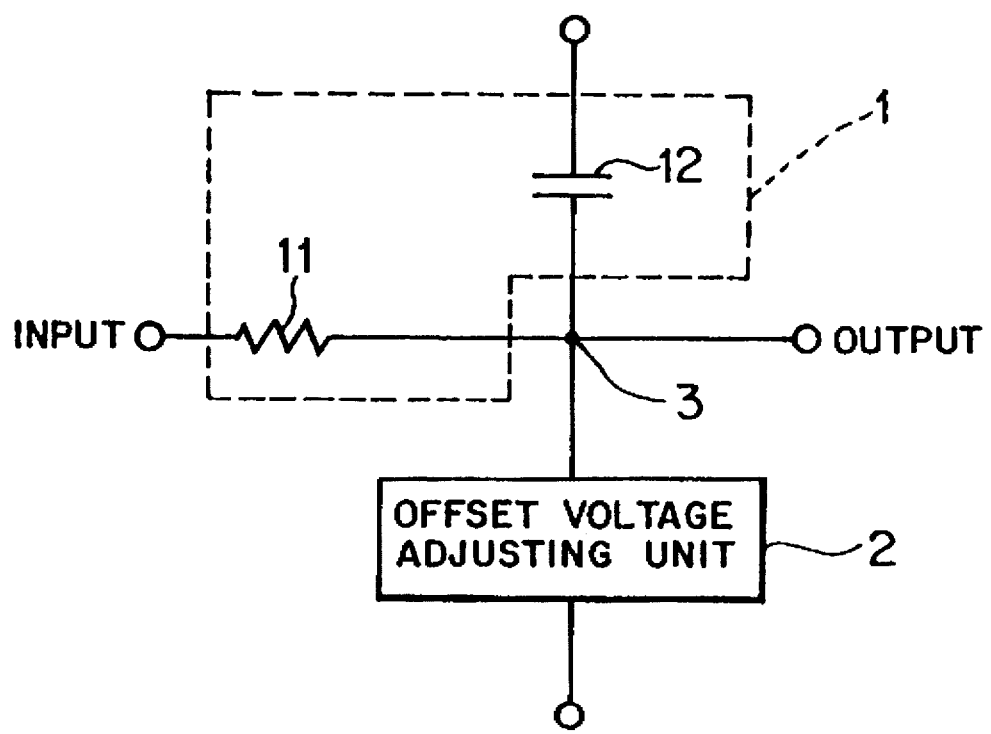
FIGS. 1 through 6 are block diagrams showing aspects of this invention.

FIG. 1 is a block diagram showing an aspect of this invention. In FIG. 1, reference numeral 1 denotes a mean value detecting unit. The mean value detecting unit 1 has a resistance 11 and a capacitance 12 for detecting a mean value of an input signal. At a connecting point 3 of the resistance 11 and the capacitance 12 in the mean value detecting unit 1, an offset voltage adjusting unit 2 is connected in parallel to the mean value detecting unit 1.

In the above mean value detecting apparatus of this invention, the mean value detecting unit 1 formed with the resistance 11 and the capacitance 12 can detect a mean value of an input signal. An offset voltage adjusting unit 2 connected in parallel to the mean value detecting unit 1 at the connecting point 3 and is utilized to adjust the voltage at the connecting point 3 of the resistance 11 and the capacitance 12.

According to the mean value detecting apparatus of this invention, it is unnecessary to separately provide individual terminals or wirings for the capacitance 12 and the offset voltage adjusting unit 2. It is therefore possible to realize a mean value detecting apparatus for adjusting an offset of the mean value detecting unit 1 in a simpler structure, and minimize the circuit size of the mean value detecting apparatus.

The above offset voltage adjusting unit 2 may be formed as a current source. This current source may be connected in parallel to the mean value detecting unit 1 at the connecting point 3 of the resistance 11 and the capacitance 12 so as to adjust the voltage at the connecting point 3.

According to the mean value detecting apparatus of this invention, the mean value detecting apparatus for adjusting an offset generated in the vicinity of the mean value detecting unit may be formed in a simpler structure.

The above offset voltage adjusting unit 2 may be formed with a series connection of a resistor having a high resistance value and a voltage source. In which case, by connecting the resistor of this circuit to the connecting point of the above resistance and the capacitance, this circuit is connected in parallel to the mean value detecting unit 1 and thereby adjusts the voltage at the connecting point 3.

In this case, this invention has an advantage that the mean value detecting apparatus for adjusting an offset of the mean value detecting unit may be readily accomplished with the above described practical circuit.

The mean value detecting apparatus shown in FIG. 1 has an offset forcibly generating unit which forcibly generates an offset between an input signal and an output signal of a mean value. Further, this offset forcibly generating unit is so formed as a circuit forcibly generating an offset that the input signal has a higher potential than the mean value output signal, or the input signal has a lower potential than the mean value output signal, conversely.

In the above mean value detecting apparatus, the offset forcibly generating unit may forcibly generate an offset between the input signal and the mean value output signal. More practically, the offset forcibly generating unit may forcibly generate an offset so that the input signal has a higher potential than the mean value output signal, or the input signal has a lower potential than the mean value output signal, conversely.

In the above mean value detecting apparatus of this invention, the offset adjusting unit adjusts the offset having been forcibly generated by the offset forcibly generating unit and having a predetermined potential so as to simply adjust an offset generated in the vicinity of the mean value detecting circuit. This invention therefore allows a simple structure of the above mean value detecting apparatus and a large reduction in size of the circuit.

The above offset forcibly generating unit is, in practice, with a first source follower circuit using a first FET and a second source follower circuit using a second FET. Threshold voltages of the first and the second FETs are set to the same value and the both source follower currents are set to the same value. In order to forcibly generate an offset between the input signal and the mean value output signal, a gate width of the first FET and a gate width of the second FET are set to different widths.

It is thereby possible to forcibly generate an offset between the input signal and the mean value output signal, as above.

According to the above mean value detecting apparatus of this invention, the above offset forcibly adjusting unit which forcibly generates an offset between the input signal and the mean value output signal may be readily formed with a practical circuit.

It is alternatively possible to set the gate width of the first FET wider than the gate width of the second FET so that the input signal has a higher potential than the mean value output signal. Conversely, it is also possible to set the gate width of the second FET wider than the gate width of the first FET so that the input signal has a lower potential than the mean value output signal.

Accordingly, it is possible to generate an offset where the input signal has a higher potential than the mean value output signal by setting the gate width of the first FET wider than the gate width of the second FET. Conversely, it is possible to forcibly generate an offset where the input signal has a lower potential than the mean value output signal by setting the gate width of th second FET wider than the gate width of the first FET.

According to the above mean value detecting apparatus of this invention, the offset adjusting unit 2 may quite readily adjust the offset generated between the input signal and the mean value output signal by simply adjusting a generated offset whose potential is predetermined. Accordingly, this invention has an advantage that the above mean value detecting apparatus may simply be formed with practical circuits and the size of the circuit may be significantly reduced.

The offset forcibly generating unit may be formed with a first source follower circuit using the first FET and a second source follower circuit using a second FET. A first constant-current source may be connected to a source of the first FET via a first diode made up of an FET, while a second constant-current source may be connected to a source of the second FET via a second diode made up of an FET.

In the above case, threshold values and gate widths of the above first and second FETs are set to the same value, and currents of the above constant-current sources are set to the same value. Further, in order to forcibly generate an offset between the input signal and the mean value output signal, a gate width of the first diode and a gate width of the second diode are set to different values so as to forcibly generate an offset between the input signal and the mean value output signal, as above.

According to this invention, it is possible, in this case, to readily accomplish the offset forcibly adjusting unit which forcibly generates an offset between the input signal and the mean value output signal with a practical circuit.

It is possible to set the gate width of the above first diode wider than the gate width of the second diode so that the input signal has a higher potential than the mean value output signal. Conversely, it is possible to set the gate width of the second diode wider than the gate width of the first diode so that the input signal has a lower potential than the mean value output signal.

It is possible to forcibly generate an offset where the input signal has a higher potential than the mean value output signal between the input signal and the mean value output signal by setting the gate width of the first diode wider than the gate width of the second diode. Conversely, it is possible to forcibly generate an offset where the input signal has a lower potential than the mean value output signal between the input signal and the mean value output signal by setting the gate width of the second diode wider than the gate width of the first diode.

In this case, according to the above mean value detecting apparatus of this invention, the offset voltage adjusting unit 2 may quite readily adjust an offset generated between the input signal and the mean value output signal by adjusting a generated offset whose potential is predetermined. This invention thus has an advantage that the above mean value detecting apparatus may be simply formed with practical circuits and the size of the circuit may be significantly reduced.

The offset forcibly generating unit may be formed with a first source follower circuit using a first FET and a second source follower circuit using a second FET. A first current source may be connected to a source of the first FET, while a second current source may be connected to a source of the second FET.

In th above case, threshold voltages and gate widths of the first and the second FETs are set to the same values, respectively. Further, in order to forcibly generate an offset between the input signal and the mean value output signal, a current value of the first current source and a current value of the second current source are set to different values, thereby forcibly generating an offset between the input signal and the mean value output signal, as above.

According to this invention, it is possible to readily accomplish the offset forcibly generating unit which forcibly generates an offset between the input signal and the mean value output signal with a practical circuit.

On this occasion, it is possible to set the current value of the second current source larger than the current value of the first current source so that the input signal has a higher potential than the mean value output signal. Conversely, it is possible to set the current value of the first current source larger than the current value of the second current source so that the input signal has a lower potential than the mean value output signal.

It is thus possible to forcibly generate an offset where the input signal has a higher potential than the mean value output signal by setting the current value of the second current source larger than the current value of the first current source. Conversely, it is possible to forcibly generate an offset where the input signal has a lower potential than the mean value output signal by setting the current value of the first current source larger than the current value of the second current source.

According to the above mean value detecting apparatus of this invention, the offset voltage adjusting unit 2 may quite readily adjust an offset generated between the input signal and the mean value output signal by adjusting a generated offset whose potential is predetermined. Accordingly, this invention has an advantage that the above mean value detecting apparatus may be simply accomplished with practical circuits and the size of the circuit may be significantly reduced.

On this occasion, the above first current source may be formed with a third FET and a third resistor connected to a source of the third FET, while the second current source may be formed with a fourth FET and a fourth resistor connected to a source of the fourth FET. In which case, a gate width of the fourth FET may be set N (N is a value of the third resistor/a value of the fourth resistor) times a gate width of the third FET so that the input signal has a higher potential than the mean value output signal. Conversely, the gate width of the third FET may be set N times the gate width of the fourth FET so that the input signal has a lower potential than the mean value output signal.

Accordingly, it is possible to forcibly generate an offset where the input signal has a higher potential than the mean value output signal by setting the gate width of the fourth FET N (N is a value of the third resistor/a value of the fourth resistor) times the gate width of the third FET. Conversely, it is possible to forcibly generate an offset where the input signal has a lower potential than the mean value output signal by setting the gate width of the third FET N times the gate width of the fourth FET.

According to the above mean value detecting apparatus of this invention, the above first and the second current sources may be quite readily accomplished with practical circuits.

In the mean value detecting apparatus of this invention, if the first current source is formed with a third FET and a third resistance connected to a source of the third FET, and a second current source is formed with a fourth FET and a fourth resistance connected to a source of the fourth FET, as same as the above case, it is possible to set a value of the third resistance larger than a value of the fourth resistance so that the input signal has a higher potential than the mean value output signal. Conversely, it is possible to set the value of the fourth resistance larger than the value of the third resistance so that the input signal has a lower potential than the mean value output signal.

It is possible to forcibly generate an offset where the input signal has a higher potential than the mean value output signal by setting the value of the third resistance higher than the value of the fourth resistance. Conversely, it is possible to forcibly generate offset where the input signal has a lower potential than the mean value output signal by setting the value of the fourth resistance than the value of the third resistance.

According to the above mean value detecting apparatus of this invention, the first and the second current sources may be quite readily accomplished with practical circuits.

In the mean value detecting apparatus of this invention, the above first current source may be formed with the third FET, while the second current source may be formed with the fourth FET. Further, a gate potential of the fourth FET may be set to a higher value than a gate potential of the third FET so that the input signal has a higher potential than the mean value output signal. Conversely, the gate potential of the third FET may be set to a higher value than the gate potential of the fourth FET so that the input signal has a lower potential than the mean value output signal.

On this occasion, it is possible to forcibly generate an offset where the input signal has a higher potential than the mean value output signal by setting the gate potential of the fourth FET to a higher value than the gate potential of the third FET. Conversely, it is possible to forcibly generate an offset where the input signal has a lower potential than the mean value output signal by setting the gate voltage of the third FET to a higher value than the gate potential of the fourth FET.

According to the above mean value detecting apparatus of this invention, the first current source and the second current source may also be formed with practical circuits quite readily. In addition to this, the size of the circuit may be reduced since no resistor is used.

Further, the mean value detecting apparatus of this invention may include a compensating circuit which is connected to an input side of the mean value detecting unit 1, and has the same temperature, source voltage fluctuation characteristic as a front stage circuit performing a necessary process on the input signal. The compensating circuit may be connected in parallel to the mean value detecting unit 1 at the connecting point of the resistance 11 and the capacitance 12 in the mean value detecting unit 1 via a resistance.

With the above arrangement, the compensating circuit having the same temperature, voltage fluctuation characteristic as the front stage circuit connected to the input side of the mean value detecting circuit 1 performs a necessary process on the input signal. The compensating circuit may further adjust an offset voltage at the connecting point of the resistance 11 and the capacitance 12 via the resistance.

According to the mean value detecting apparatus of this invention, an error of a mean value due to a fluctuation of the temperature or the source voltage in the mean value detecting unit 1 may be compensated by the compensating circuit, whereby a reliability of the mean value detection of the input signal may be largely improved.

Figure 2:
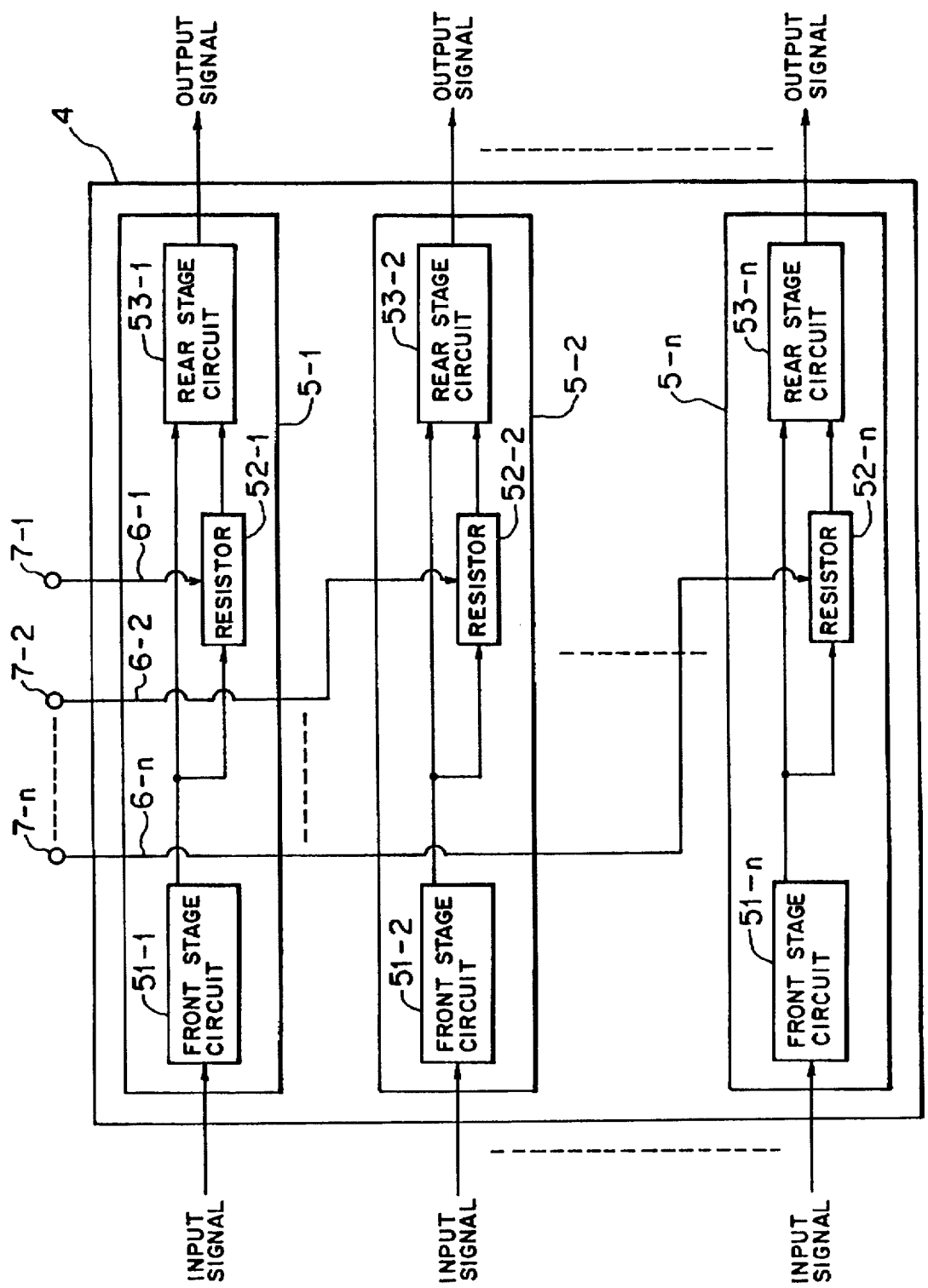

FIG. 2 is a block diagram showing another aspect of this invention. As shown in FIG. 2, integrated circuit 4 has circuit units 5-1, ... 5-n for n channels (n is a natural number). Each of the circuit units 5-1, ... 5-n has a front stage circuit 51-1, ... 51-n, a resistance 52-1, ... 52-n and a rear stage circuit 53-1, ... 53-n.

The front stage circuit 51-1, ... 51-n performs a necessary process on an input signal. The resistor 52-1, ... 52-n is an element constituting a mean value detecting unit (not shown) that should be made up of a resistance and a capacitance. The resistor 52-1, ... 52-n is used to detect a mean value of an output of the front stage circuit 51-1, ... 51-n from this output. The rear stage circuit 53-1, ... 53-n performs a necessary process on a mean value output signal obtained through the resistor 52-1, ... 52-n.

In the above integrated circuit 4, strip lines 6-1, ... 6-n are formed in a direction intersecting an input-output direction of the circuit units 5-1, ... 5-n. At an end of each of the strip lines 6-1, ... 6-n, a connecting terminal 7-1, ... 7-n for the capacitance which is the element constituting the mean value detecting unit and an offset voltage adjusting unit.

In the above mean value detecting integrated circuit 4 of this invention shown in FIG. 2, the front stage circuit 51-i (i=1, 2, ..., n) may perform a necessary process on the input signal within each of the circuit units 5-i, ... 5-n provided for plural channels, the mean value detecting unit (not shown) that should be made up of the resistor 52-i and a capacitance may detect a mean value of an output of the front stage circuit 51-i from this output, and the rear stage circuit 53-i may perform a necessary process on a mean value output signal from the mean value detecting unit.

The strip line 6-i is formed in a direction intersecting the input-output direction of each of the circuit units 5-i and the connecting terminal 7-i is provided at an end of each of the strip lines 6-i, thereby connecting the capacitance which is the element constituting the mean value detecting unit and the offset voltage adjusting unit to the connecting terminal 7-i.

According to the mean value detecting integrated circuit of this invention shown in FIG. 2, it is possible to provide the capacitance which is the element constituting the mean value detecting unit and the offset voltage adjusting unit outside the integrated circuit 4 by connecting them to the connecting terminal 7-i used to connect them. This arrangement is helpful to largely reduce the size of a circuit of the mean value detecting integrated circuit 4.

In the above integrated circuit 4, a connecting terminal for the capacitance which is the element constituting the mean value detecting unit may be provided at an end of the above strip line 6-i, besides a connecting terminal for the voltage source which is an element constituting the above offset voltage adjusting unit may be provided at the end of the strip line 6-i via a high resistance.

Whereby, it is possible to connect the capacitance which is the element constituting the mean value detecting unit to the connecting terminal 7-i, and connect the voltage source which is the element constituting the offset voltage adjusting unit to the connecting terminal for the voltage source through the high resistance.

According to the above mean value detecting integrated circuit of this invention, it is possible to connect the capacitance which is the element constituting the mean value detecting unit and the voltage source which is the element constituting the offset voltage adjusting unit to the respective connecting terminal so that the capacitance and the voltage source are provided outside the integrated circuit 4. This arrangement is helpful to largely reduce the circuit size of the mean value detecting integrated circuit 4.

In the above mean value detecting integrated circuit 4, it is possible to further provide a compensating circuit having the same temperature, source voltage fluctuation characteristic as the front stage circuit 51-i, an output terminal for outputting an output from the compensating circuit, and an input terminal at an end of each of the strip lines 6-i which is connected to the output terminal for the compensating circuit for receiving the output from the compensating circuit.

In the above mean value detecting integrated circuit 4, an output of the compensating circuit having the same temperature, source voltage fluctuating characteristic as the front stage circuit 51-i is outputted from the output terminal, then inputted to the input terminal which is provided at an end of the strip line 6-i and connected to the output terminal for the above compensating circuit.

According to the above mean value detecting integrated circuit 4 of this invention, the error of the mean value due to a fluctuation in temperature or source voltage in the mean value detecting unit may be compensated, and thus the performance of the mean value detecting integrated circuit 4 may be largely improved.

In the above mean value integrated circuit 4, it is possible to form the front stage circuit 51-i as a preamplifier and the rear stage circuit 53-i as a differential amplifier which receives an output from the above preamplifier and an output of the mean value detecting unit by differential inputs.

Whereby, the front stage circuit 51-i formed as a preamplifier performs a necessary process on the input signal, an output of the above preamplifier and an output of the mean value detecting unit are inputted to the rear stage circuit 53-i formed as a differential amplifier as differential inputs.

According to the above mean value detecting integrated circuit of this invention, the above mean value detecting integrated circuit 4 may be accomplished with practical circuits more easily.

Figure 3:
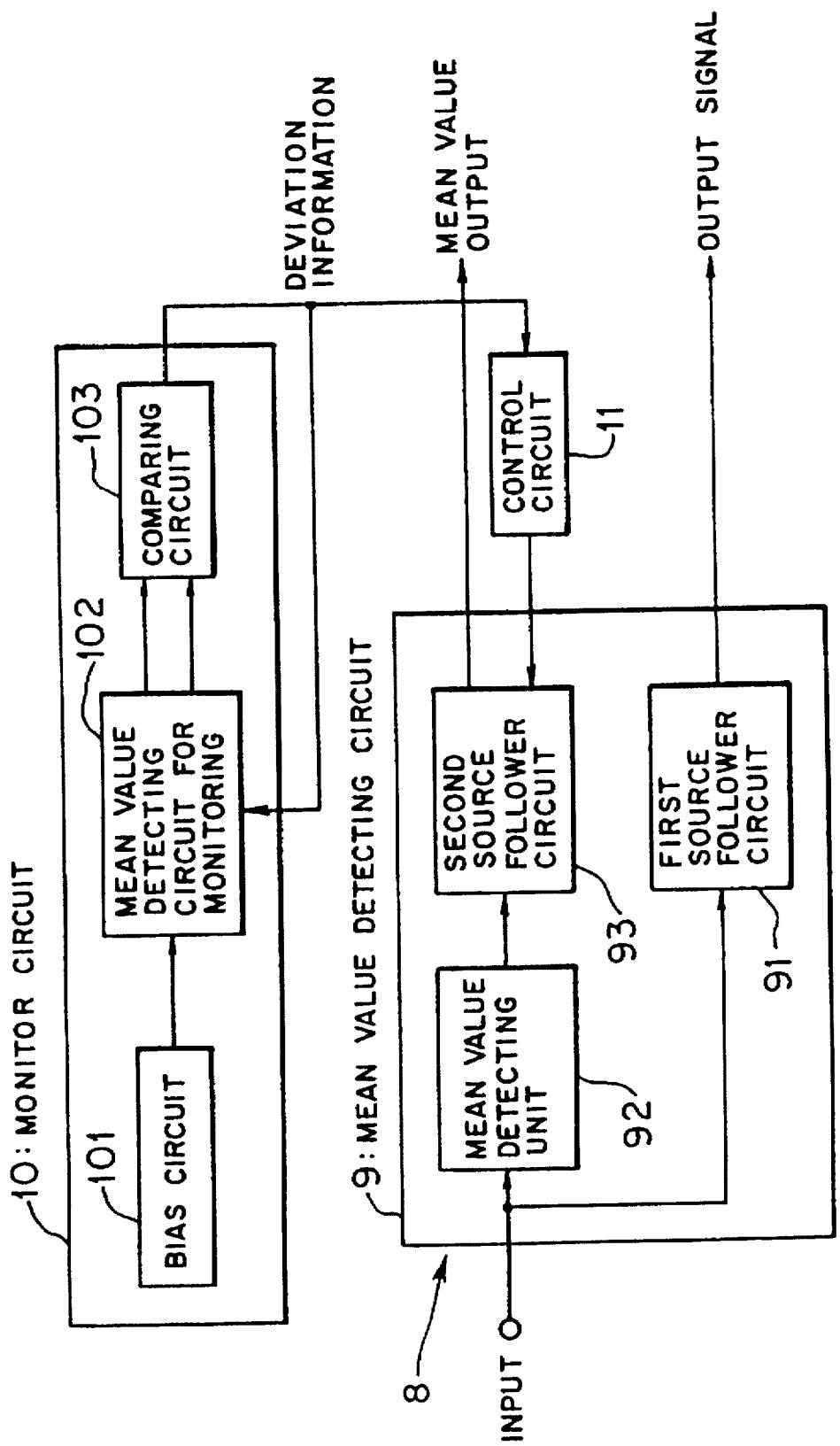

FIG. 3 is a block diagram showing still another aspect of this invention. As shown in FIG. 3, a mean value detecting apparatus 8 has a mean value detecting circuit 9, a monitor circuit 10 and a control circuit 11.

The mean value detecting circuit 9 has a mean value detecting unit 92 formed with a resistance and a capacitance for detecting a mean value of an input signal, a first source follower circuit 91 using a first FET and a second source follower circuit 93 using a second FET.

In order to cancel a potential difference generated due to a leak current from the second FET in the second source follower circuit 93 in the mean value detecting circuit 9 having the above structure, the monitor circuit 10 has a bias circuit 101, a mean value detecting circuit for monitoring 102 and a comparing circuit 103 of a direct-current amplifier type.

The mean value detecting circuit for monitoring 102 has the same structure as the mean value detecting circuit, which receives an output from the bias circuit 101 as an input signal. The comparing circuit 103 compares an input signal and an output signal of the mean value detecting circuit for monitoring 102 to feed back its deviation information as a feedback signal to the mean value detecting circuit for monitoring 102.

The control circuit 11 controls a source follower current of the second source follower circuit 93 by using the deviation information as the feedback signal of the above monitoring circuit 10.

In the mean value detecting apparatus 8 shown in FIG. 3, the mean value detecting unit 92 made up of the resistance and the capacitance for detecting a mean value of the input signal, the first source follower circuit 91 using the first FET and the second source follower circuit 93 using the second FET may detect a mean value of the input signal in the mean value detecting circuit 9, to begin with.

On this occasion, in the monitor circuit 10, the mean value detecting circuit for monitoring 102 having the same structure as the mean value detecting circuit 9 detects a mean value with an output from the bias circuit 101 as an input signal. The comparing circuit 103 of a direct-current amplifier type compares an input signal and an output signal of the mean value detecting circuit for monitoring 102 and feeds back its deviation information as a feedback signal to the mean value detecting circuit for monitoring 102.

The control unit 11 controls a source follower current of the second source follower circuit 93 using the deviation information as the feed back signal of the monitor circuit 10 to cancel a potential different generated due to a leak current of the second FET in the second source follower circuit 93.

The mean value detecting apparatus 8 of this invention shown in FIG. 3 may suppress an error in the mean value detection in the mean value detecting circuit 9, which is caused from a potential difference occurring due to a leak current from the second FET of the second source follower circuit 93. This invention may largely improve the performance of the mean value detecting apparatus 8.

Figure 4:
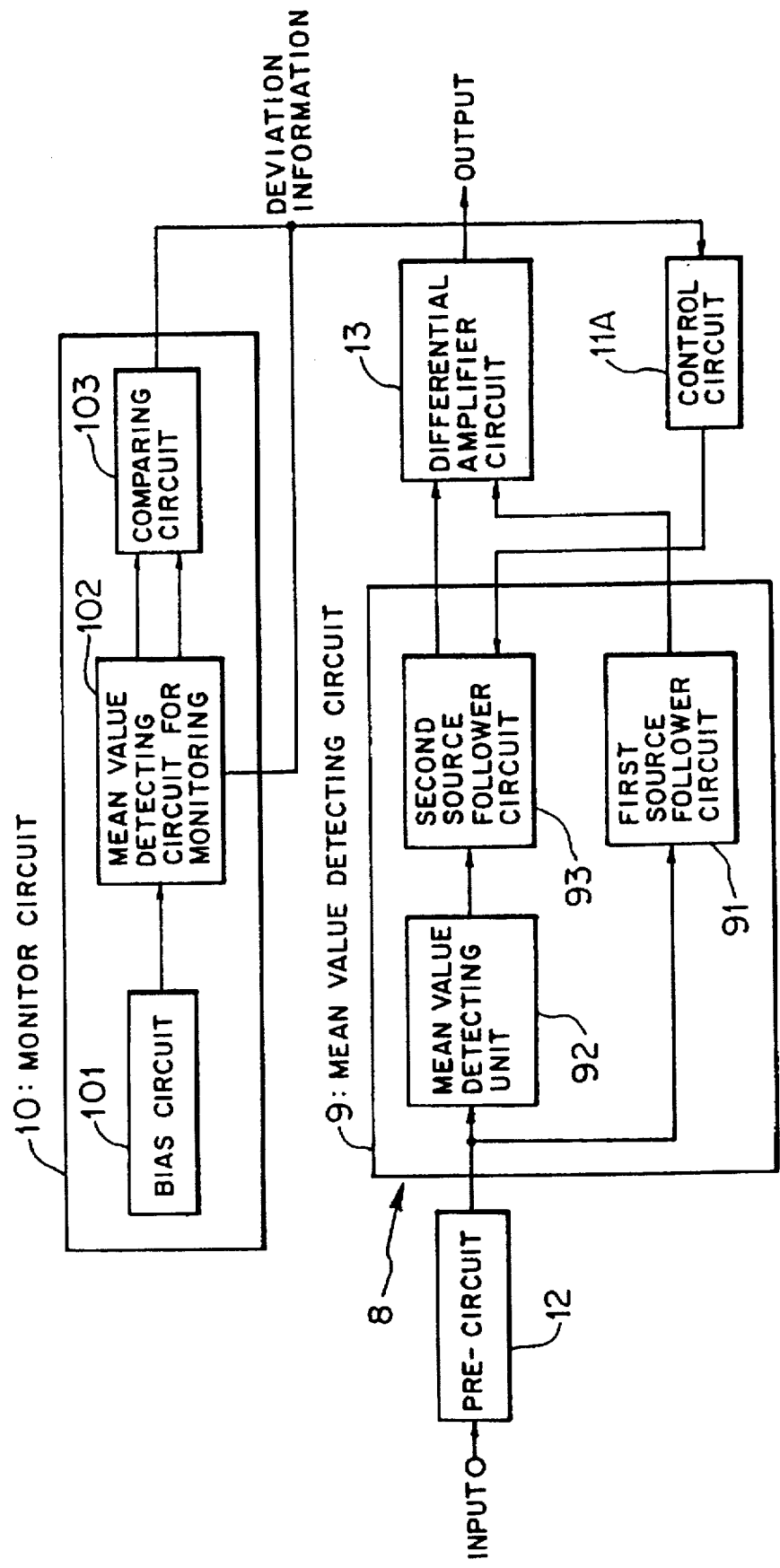

FIG. 4 is a block diagram showing still another aspect of this invention. A mean value detecting apparatus 8 shown in FIG. 4 has a pre-circuit 12 and a differential amplifier circuit 13, in addition to the elements having been described with reference to FIG. 3, besides a control unit 11A instead of the control unit 11 having been described with reference to FIG. 3. In consequence, other structural elements are similar to those having been described with reference to FIG. 3, no description of those is thus made here. Description will be now made of only the pre-circuit 12, the differential amplifier circuit 13 and the control circuit 11A.

The pre-circuit 12 performs a necessary process on an input signal. The differential amplifier circuit 13 receives an output of the pre-circuit 12 and an output of the mean value detecting circuit 9 as differential inputs. The control circuit 11A controls a source follower current of a second source follower circuit 93 by utilizing deviation information as a feedback signal of a monitoring circuit 10 to cancel a potential difference generated due to a leak current at an input point of the differential amplifier circuit 13.

In the mean value detecting apparatus 8 shown in FIG. 4, the pre-circuit 12 performs a necessary process on the input signal, the mean value detecting circuit 9 detects a mean value of an output from the pre-circuit 12, and the differential amplifier circuit 13 receives an output of the pre-circuit 12 and an output of the mean value detecting circuit 9 as differential inputs.

The mean value detecting circuit 9 detects a mean value of an output from the pre-circuit 12 by means of the mean value detecting unit 92 made up of a resistance and a capacitance in order to detect a mean value of the output of the pre-circuit 12, the first source follower circuit 91 using a first FET and the second source follower circuit 93 using a second FET.

On this occasion, in the monitor circuit 10, the mean value detecting circuit for monitoring 102 having the same structure as the mean value detecting circuit 9 receives an output from the bias circuit 101 as an input signal and detects a mean value thereof, and the comparing circuit 103 of a direct-current amplifier type compares an input signal and an output signal of the mean value detecting circuit for monitoring 102 and feeds back its deviation information as a feedback signal to the mean value detecting circuit for monitoring 102.

The control unit 11 controls a source follower current of the second source follower circuit 93 by using the deviation information as a feedback signal of the monitoring circuit 10 to cancel a potential difference generated due to a leak current from the second FET in the second source follower circuit 93 at an input point of the differential amplifier circuit.

According to this invention, the mean value detecting apparatus 8 of this invention shown in FIG. 4 may be quite readily accomplished with practical circuits. In addition to this, it is possible to suppress an error in the mean value detection in the mean value detecting circuit 9 resulted from a potential difference due to a leak current from the second FET in the second source follower circuit 93, which leads to a large improvement in performance of the mean value detecting apparatus 8.

The above bias circuit 101 may be formed as a circuit having the same temperature, source voltage fluctuation characteristic as the pre-circuit 12, or the same circuit as the pre-circuit 12. Whereby, the detecting circuit for monitoring 102 may detect a mean value with outputs from these circuits as inputs, and the comparing circuit 103 of a direct-current amplifier type may compare an input signal and an output signal of the mean value detecting circuit for monitoring 102 to feed back its deviation information as a feedback signal to the mean value detecting circuit for monitoring 102.

The above mean value detecting apparatus 8 of this invention has advantages that it is possible to completely correspond the deviation information as a feedback signal of the monitor circuit 10 to the temperature, source voltage fluctuation characteristic or a characteristic of the pre-circuit 12, thereby cancelling a potential difference generated due to the above leak current mope effectively. It is also possible to largely improve the performance of the mean value detecting apparatus 8.

Figure 5:
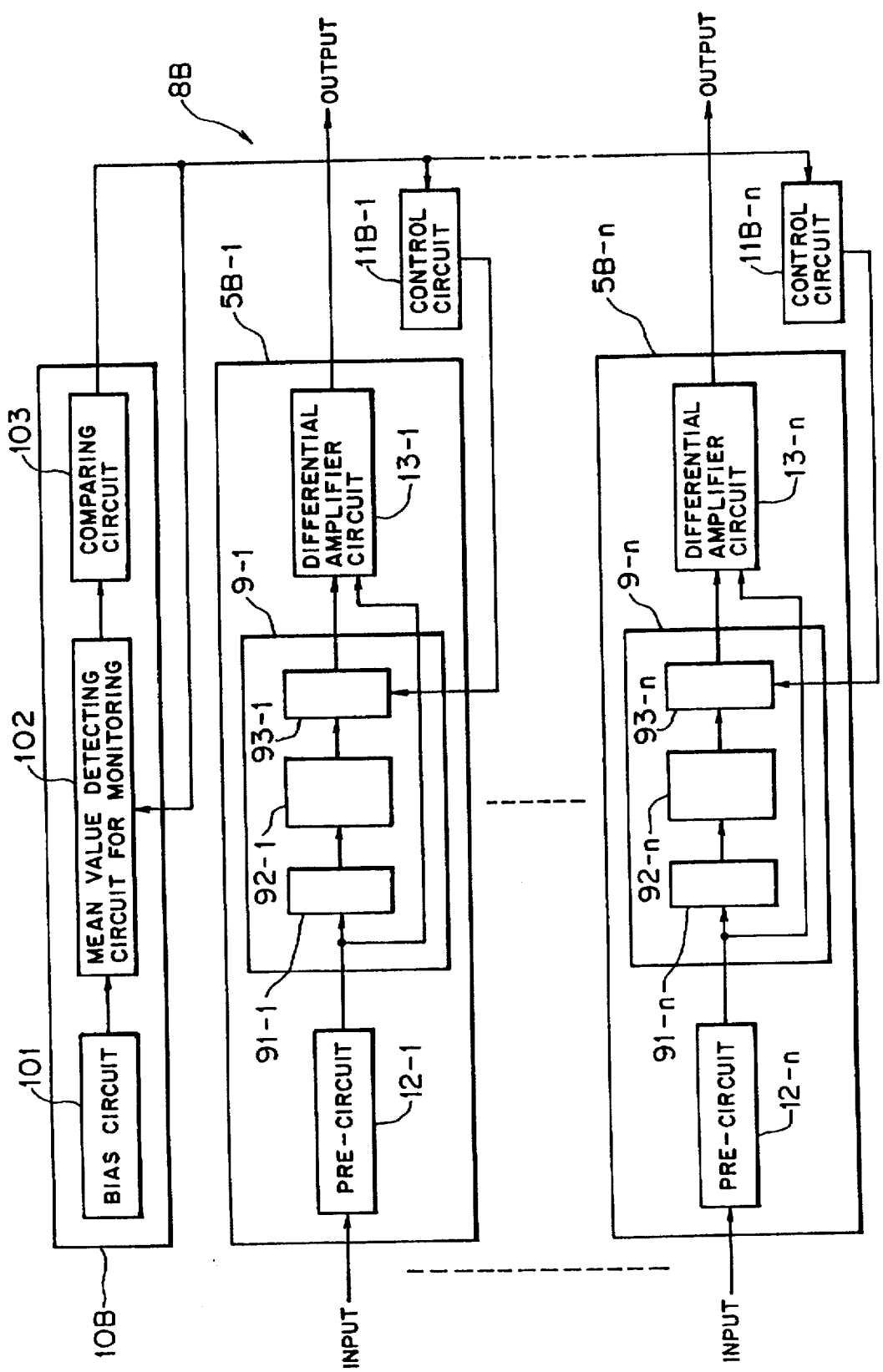

FIG. 5 is a block diagram of still another aspect of this invention. A mean value detecting apparatus 8B shown in FIG. 5 has a monitor circuit 10B and circuit units 5B-1, . . . . 5B-n for plural channels. The mean value detecting apparatus 8 also has control units 11B-1, . . . 11B-n (any n is a natural number) for the plural channels.

The monitor circuit 10B is similar to the monitor circuit 10 having been described with reference to FIG. 4. The monitor circuit 10B is in common to the plural channels. A pre-circuit 12-1, . . . 12-n, a mean value detecting circuit 9-1, . . . 9-n and a differential amplifier circuit 13-1, . . . 13-n in each of the circuit units 5B-1, . . . 5B-n are similar to the pre-circuit 12, the mean value detecting circuit 9 and the differential amplifier circuit 13 having been described with reference to FIG. 4, respectively.

Accordingly, a first source follower circuit 91-1, . . . 91-n, a mean value detecting unit 92-1, . . . 92-n, and a second source follower circuit 93-1, . . . 93-n in each of the mean value detecting circuit 9-1, . . . 9-n are similar to the first follower circuit 91 in the mean value detecting circuit 9 and the second source follower circuit 93 in the mean value detecting unit 92 having been described with reference to FIG. 4, respectively.

Each of the control circuits 11B-1, ... 11B-n is similar to the control circuit 11A having been described with reference to FIG. 4. Here, the control circuits 11B-1, ... 11B-n each controls a source follower current of the corresponding second source follower circuit 91-1, ... 91-n by using deviation information as a feedback signal of the common monitor circuit 10 to cancel a potential difference due to a leak current at an input point of the corresponding differential amplifier circuit 13-1, ... 13-n.

In each of the circuit units 5B-1, ... 5B-n which are provided for the plural channels in the mean value detecting apparatus 8B shown in FIG. 5, the pre-circuit 12-1, ... 12-n performs a necessary process on an input signal, the mean value detecting circuit 9-1, ... 9-n detects a mean value of an output of the pre-circuit 12-1, ... 12-n, and the differential amplifier circuit 13-1, ... 13-n receives an output of the pre-circuit 12-1, ... 12-n and an output of the mean value detecting circuit 9-1, ... 9-n as differential inputs.

The mean value detecting circuit 9-1, ... 9-n can detects a mean value of an output of the pre-circuit 12-1, ... 12-n by means of the mean value detecting unit 92-1, ... 92-n made up of a resistance and a capacitance in order to detect a mean value of the output of the pre-circuit 12-1, ... 12-n, the first source follower circuit 91-1, ... 91-n using the first FET and the second source follower circuit 93-1, ... 93-n using the second FET.

In the monitor circuit 10B common to each channel, the mean value detecting circuit for monitoring 102 having the same structure of the mean value detecting circuit 9-1, ... 9-n detects a mean value with an output from the bias circuit 101 as an input signal, and the comparing circuit 103 of a direct-current amplifier type compares an input signal and an output signal of the mean value detecting circuit for monitoring 102 to feed back its deviation information as a feedback signal to the mean value detecting circuit for monitoring 102.

The control unit 11B-1, ... 11B-n provided for each channel controls the source follower current of the second source follower circuit 93-1, ... 93-n by using the deviation information as the feedback signal of the monitor circuit 10B to cancel a potential difference generated due to a leak current of the second FET of the second source follower circuit 93-1, ... 93-n at an input point of the differential amplifier circuit 13-1, ... 13-n.

According to this invention, the mean value detecting apparatus 8B for plural input signals of this invention shown in FIG. 5 may be quite readily accomplished with practical circuits. This invention has advantages that it is possible to suppress an error in the mean value detection in each of the mean value detecting circuits 9-1, ... 9-n caused from a potential difference generated due to a leak current from the second FET of the second source follower circuit 93-1, ... 93-n, and thus improve largely a performance of the mean value detecting apparatus 8B. It is also possible to reduce the size of a circuit of the above mean value detecting apparatus 8B since the monitoring circuit 10B is used in common in plural channels.

The above-mentioned common bias circuit 10B may be formed as the same circuit as the pre-circuit 12-1, ... 12-n. In which case, in the monitor circuit 10B, the mean value detecting circuit 102 having the same structure as the mean value detecting circuit 9-1, ... 9-n detects a mean value with an output signal from the bias circuit 101 as an input signal, the comparing circuit 103 of a direct-current amplifier type compares an input signal and an output signal of the mean value detecting circuit for monitoring 102 to feed back its deviation information as a feedback signal to the mean value detecting circuit for monitoring 102.

The above mean value detecting apparatus 8B allows the deviation information as a feedback signal of the monitoring circuit 10B to have the same characteristic of each of the pre-circuits 12-1, ... 12-n, thereby cancelling an potential difference generated due to the above leak current more effectively. It is further possible to improve a performance of the mean value detecting apparatus 8B having the circuit units 5B-1, ... 5B-n provided for the plural channels as above stated to a large extent.

Figure 6:
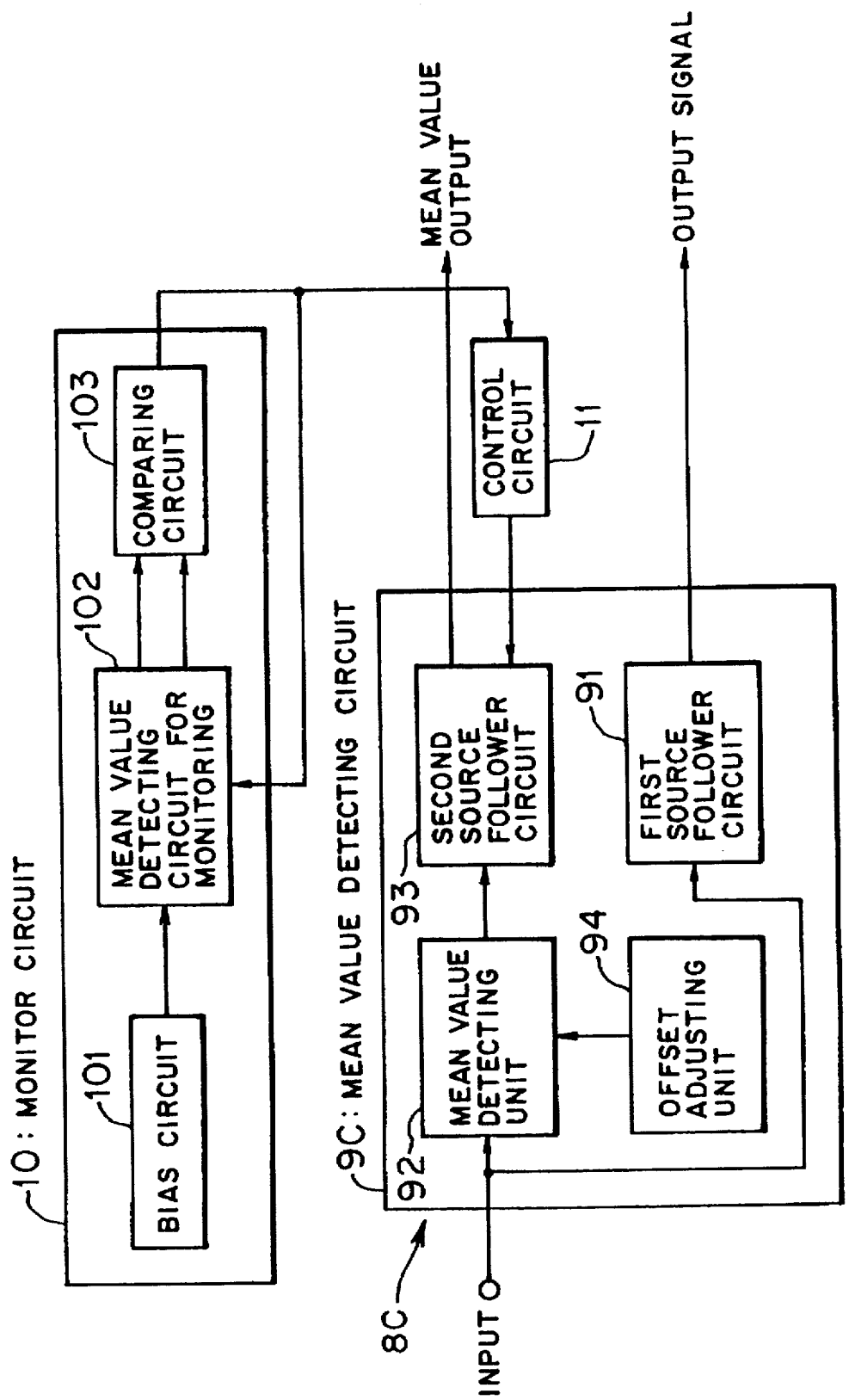

FIG. 6 is a block diagram showing still another aspect of this invention. A mean value detecting apparatus 8C shown in FIG. 6 has a monitor circuit 10 and a control circuit 11 similar to those of the mean value detecting circuit 9C having been described with reference to FIG. 3.

The mean value detecting circuit 9C in this case has a first source follower circuit 91, a mean value detecting unit 92 and a second source follower circuit 93 similar to those having been described with reference to FIG. 3. In addition to these, the mean value detecting circuit 9C has an offset voltage adjusting unit 94 similar to that having been described with reference to FIG. 1. The offset voltage adjusting unit 94 is connected in parallel to the mean value detenting unit 92 at a connecting point of a resistance and a capacitance in the mean value detecting unit 92.

The mean value detecting apparatus 8C shown in FIG. 6 may detect a mean value of an input signal by means of the mean value detecting unit 92 formed with a resistance and a capacitance in order to detect a mean value of the input signal, the offset voltage adjusting unit 94 connected in parallel to the mean value detecting unit 92 at a connecting point of the above resistance and the capacitance in the mean value detecting unit 92, the first source follower circuit 91 using a first FET and the second source follower circuit 93 using a second FET in the mean value detecting circuit 9D.

On this occasion, in the monitor circuit 10, a mean value detecting circuit 102 having the same structure as the mean value detecting circuit 9D receives an output from the bias circuit 101 as an input signal and detects its mean value, and a comparing circuit 103 of a direct-current amplifier type compares an input signal and an output signal of the mean value detecting circuit for monitoring 102 to feed back its deviation information as a feedback signal to the mean value detecting circuit for monitoring 102.

The control circuit 11 controls a source follower current of the second source follower circuit 93 by using the deviation information as the feedback signal of the monitoring circuit 10 to cancel a potential difference due to a leak current from the second FET of the second source follower circuit 93 at an input point of the differential amplifier circuit.

According to this invention, the mean value detecting apparatus 8C shown in FIG. 6 may suppress an error in the mean value detection by the mean value detecting circuit 9C caused from a potential difference generating due to a leak current from the second FET in the second source follower circuit 93. Further, the offset voltage adjusting unit 94 may decrease this error. This may improve further performance of the mean value detecting apparatus 8C to a large extent.

(b) Description of First Embodiment of this Invention

Next, description will be made of a first embodiment of this invention referring to the drawings.

Figure 7:
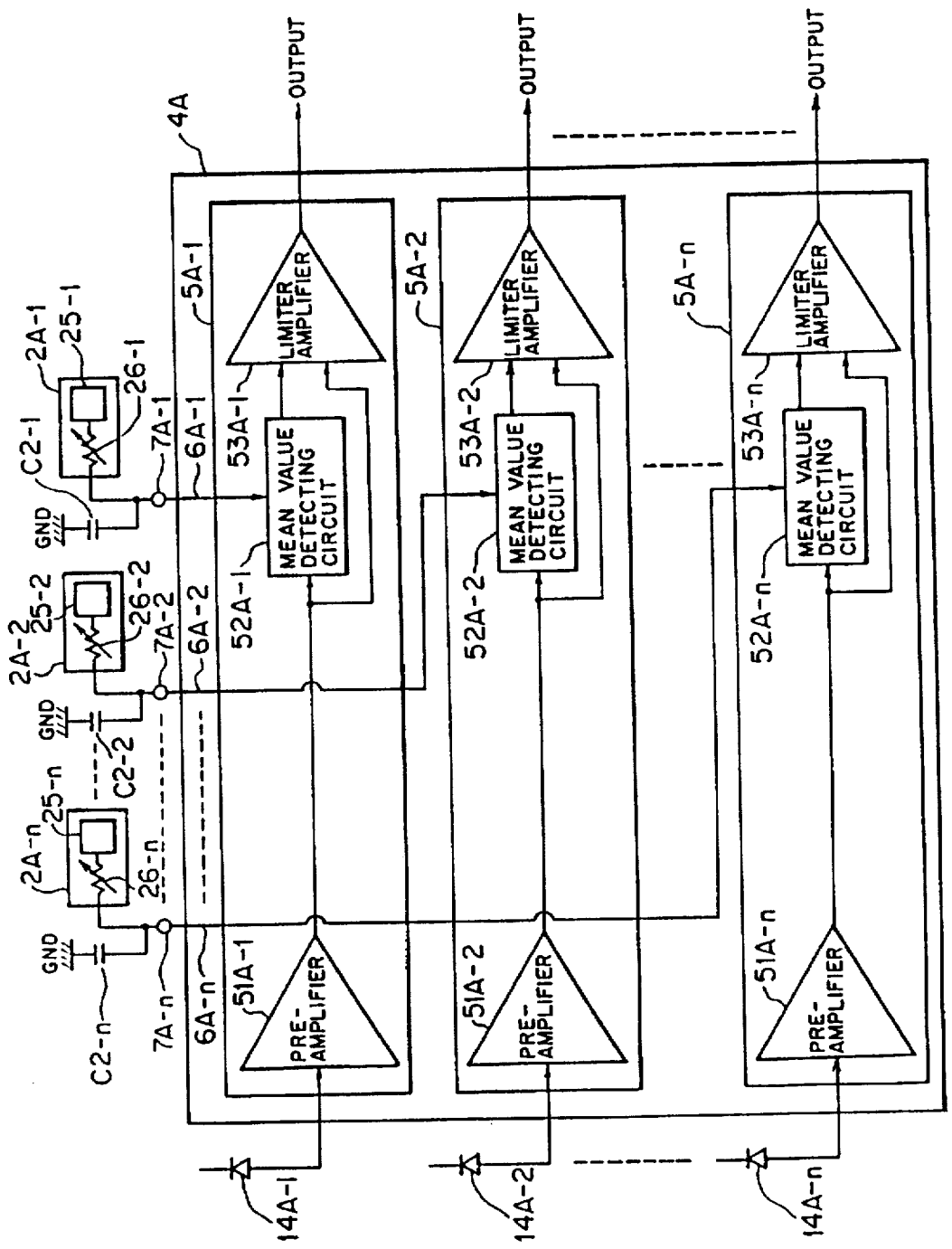
FIG. 7 is a block diagram showing a structure of a mean value detecting integrated circuit according to a first embodiment of this invention.

FIG. 7 is a block diagram showing a structure of a mean value detecting integrated circuit as a first embodiment of this invention. As shown in FIG. 7, the mean value detecting integrated circuit 4A (referred simply as an integrated circuit occasionally, hereinafter) has circuit unit 5A-1, . . . 5A-n for n channels (n is a natural number). Incidentally, reference numerals 14A-1, . . . 14A-n denote light receiving elements, each of which photoelectrically converts a light signal received to an electric signal.

Each of the circuit units 5A-1, . . . 5A-n has a preamplifier 51A-1, . . . 51A-n, a mean value detecting circuit 52A-1, . . . 52A-n, and a limiter amplifier (a differential amplifier) 53A-1, . . . 53A-n, respectively.

The preamplifier 51A-1, . . . 51A-n amplifies a signal photoelectrically converted by the light receiving element 14A-1, . . . 14A-n to a signal in a desired level, forming a front-stage circuit performing a necessary process on an input signal. The mean value detecting circuit 52A-1, . . . 52A-n detects a mean value of the input signal amplified by the preamplifier 51A-1, . . . 51A-n. The limiter amplifier 53A-1, . . . 53A-n receives an output from the preamplifier 51A-1, . . . 51A-n and a mean value output as a reference signal from the mean value detecting circuit 52A-1, . . . 52A-n as difference inputs, amplifies it to a signal in a desired level and outputs it. The limiter amplifier 53A-1 . . . 53A-n forms a rear-stage circuit performing a necessary process on a mean value output from the mean value detecting circuit 52A-1, . . . 52A-n.

In the mean value detecting circuit 4A with the above structure, it is possible that the light receiving element 14A-1, . . . 14-n photoelectrically converts a light signal (an input signal) into an electric signal, the preamplifier 51A-1, . . . 51A-n amplifies this signal to a signal in a desired level, the mean value detecting circuit 52A-1, . . . 52A-n detects a mean value of the input signal, and the limiter amplifier 53A-1, . . . 53A-n compares an input signal from the preamplifier 51A-1, . . . 51A-n and a mean value output as a reference signal from the mean value detecting circuit 52A-1, . . . 52A-n, amplifies the input signal from the preamplifier 51A-1, . . . 51A-n to a signal in a desired level and outputs it, as well as before.

The mean value detecting integrated circuit 4A of this invention differs from the general arts in that strip lines 6A-1, . . . 6A-n are formed for the respective channels in right angles to a direction of an input-output direction of each circuit unit 5A-1, . . . 5A-n. Connector terminals 7A-1, . . . 7A-n each for a capacitor (a capacitance) C2-1, . . . C2-n as an element constituting each mean value detecting circuit 52A-1, 52A-2, . . . 52A-n and an offset voltage adjusting circuit 2A-1, . . . 2A-n in which a source 25-1, . . . 25-n and a variable resistor (a high resistor) 26-1, . . . 26-n are connected in series to each other are provided at respective ends of the strip lines 6A-1, . . . 6A-n.

In the above described mean value detecting integrated circuit 4A having the above structure, the capacitor C2-1, . . . C2-n as an element constituting the mean value detecting circuit 52A-1, . . . 52A-n and the offset voltage adjusting circuit 2A-1, . . . 2A-n are such connected to the corresponding connecting terminal 7A-1, . . . 7A-n, as to be provided outside the integrated circuit 4A. This arrangement may largely decrease the size of the mean value detecting integrated circuit 4A.

As shown in FIG. 7, one strip line 6A-1, . . . 6A-n intersecting the corresponding circuit unit 5A-1, . . . 5A-n is formed for each channel. This is advantageous to avoid an effect by another channel.

Figure 8:
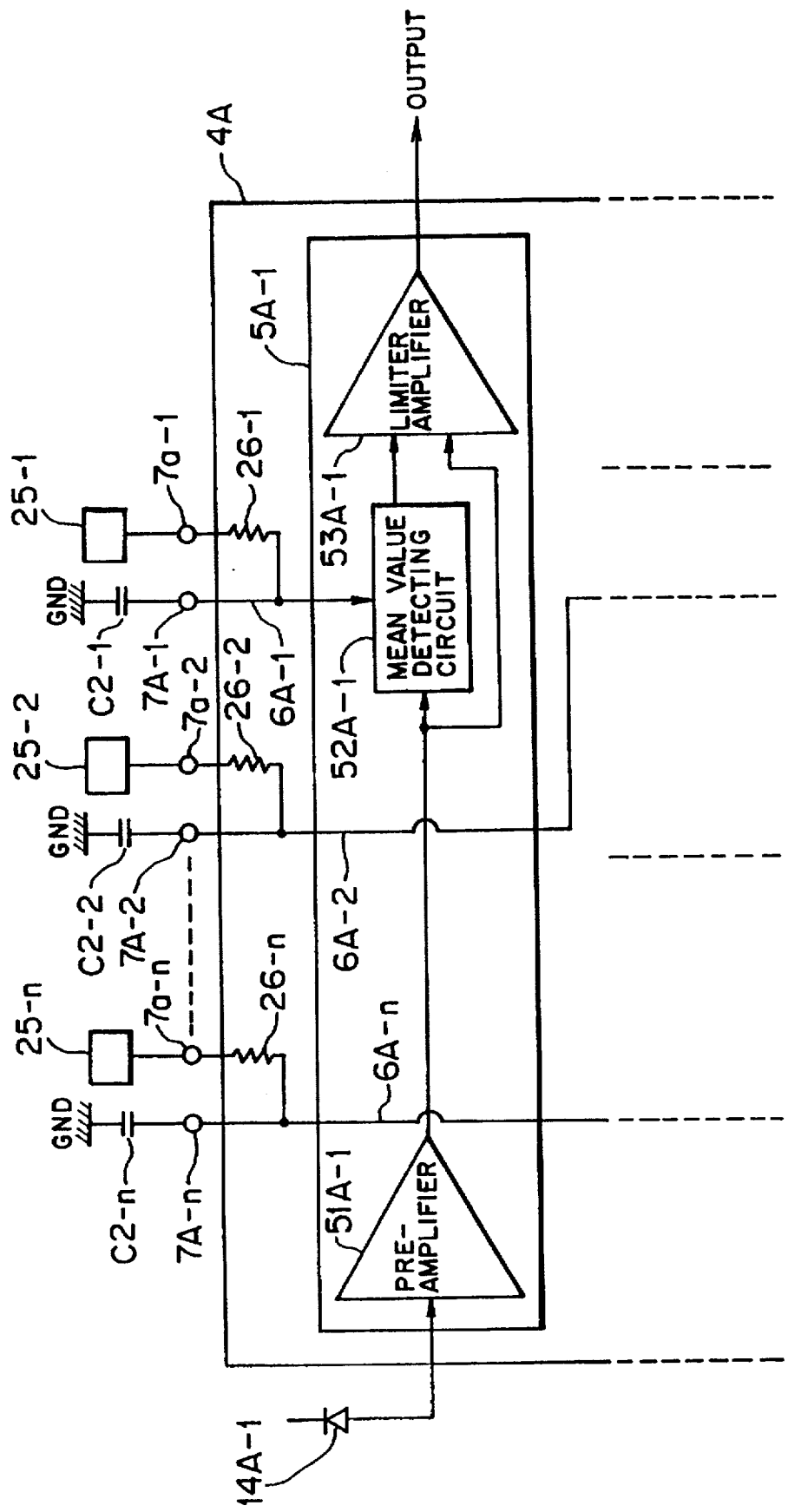
FIG. 8 is a block diagram showing another structure of the mean value detecting integrated circuit according to the first embodiment of this invention.

As shown in FIG. 8, it is alternatively possible to provide a connecting terminal 7A-1, . . . 7A-n for the capacitance C2-1, . . . C2-n which is an element constituting the mean value detecting circuit 52A-1, . . . 52A-n as well as the above example, the high resistor 26-1, . . . 26-n, which is an element constituting the corresponding offset voltage adjusting circuit 2A-1, . . . 2A-n in the integrated circuit 4A, the connecting terminal 7a-1, . . . 7a-n for the corresponding source 25-1, . . . 25-n which is an element constituting the corresponding offset voltage adjusting circuit 2A-1, . . . 2A-n via the corresponding high resistor 26-1, . . . 26-n, and connect them.

In the above case, the high resistor 26-1, . . . 26-n are elements forming corresponding offset voltage adjusting circuit 2A-1, . . . 2A-n may be provided within the integrated circuit 4A with one strip line 6A-1, . . . 6A-n for each channel intersecting the corresponding circuit units 5A-1, . . . 5A-n, thereby decreasing the number of parts (resistors) connected to the outside of the integrated circuit 4A, further decreasing the size of the mean value detecting integrated circuit 4A.

Figure 10:
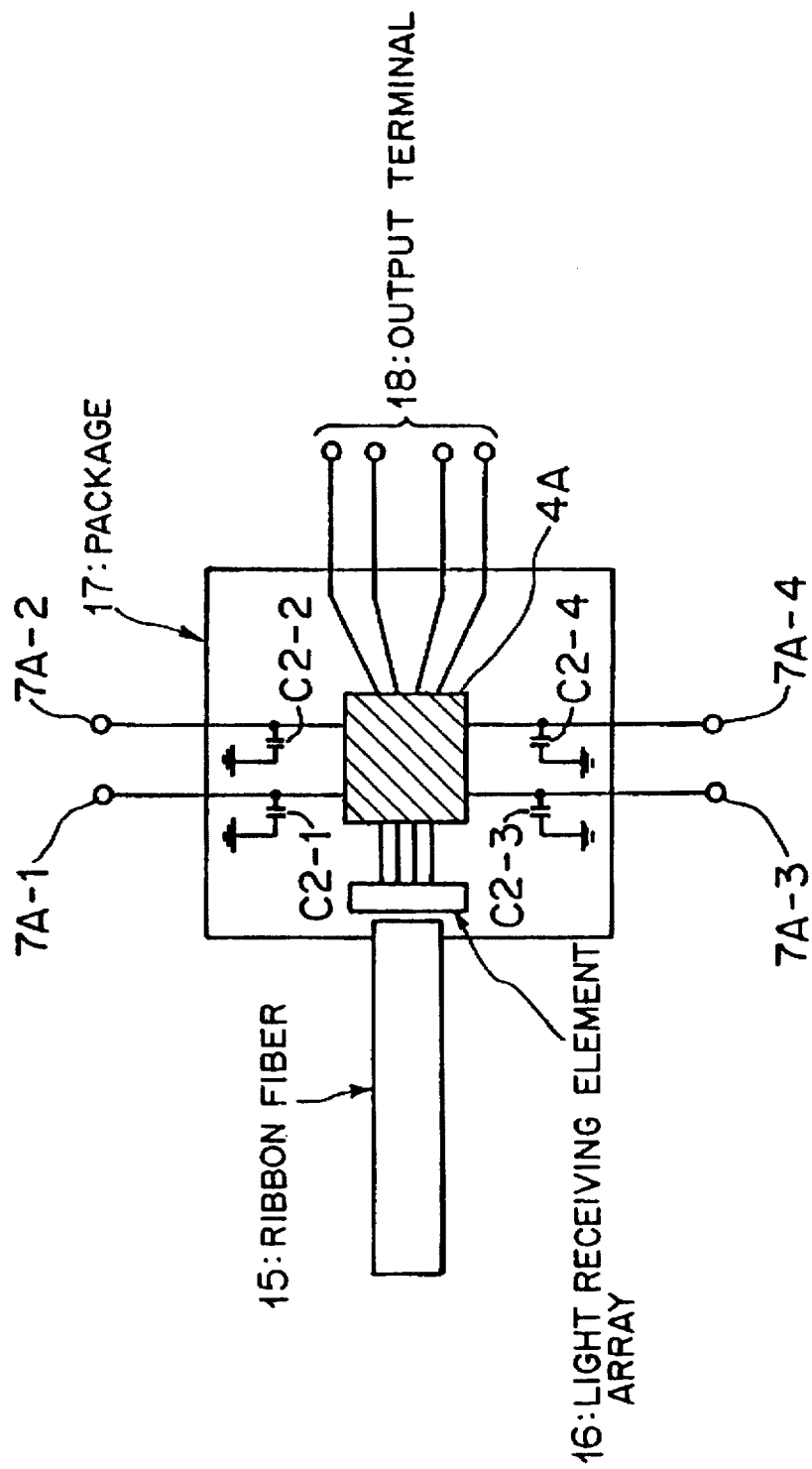
FIG. 10 shows an external appearance of the mean value detecting integrated circuit according to the first embodiment of this invention.

FIG. 10 shows an external appearance of the mean value detecting integrated circuit 4A having the above structure shown in FIG. 7. As shown in FIG. 10, the mean value detecting circuit 4A having the capacitors C2-1 . . . C2-4 outside and the light receiving element array 16 are formed within a package 17. With this structure, the light receiving array 16 changes an optical signal send through a ribbon fiber 15 into an electric signal, and the mean value detecting integrated circuit 4A detects a mean value of the signal as having been described with reference to FIG. 7 and outputs a desired signal from output terminals 18.

Figure 9:
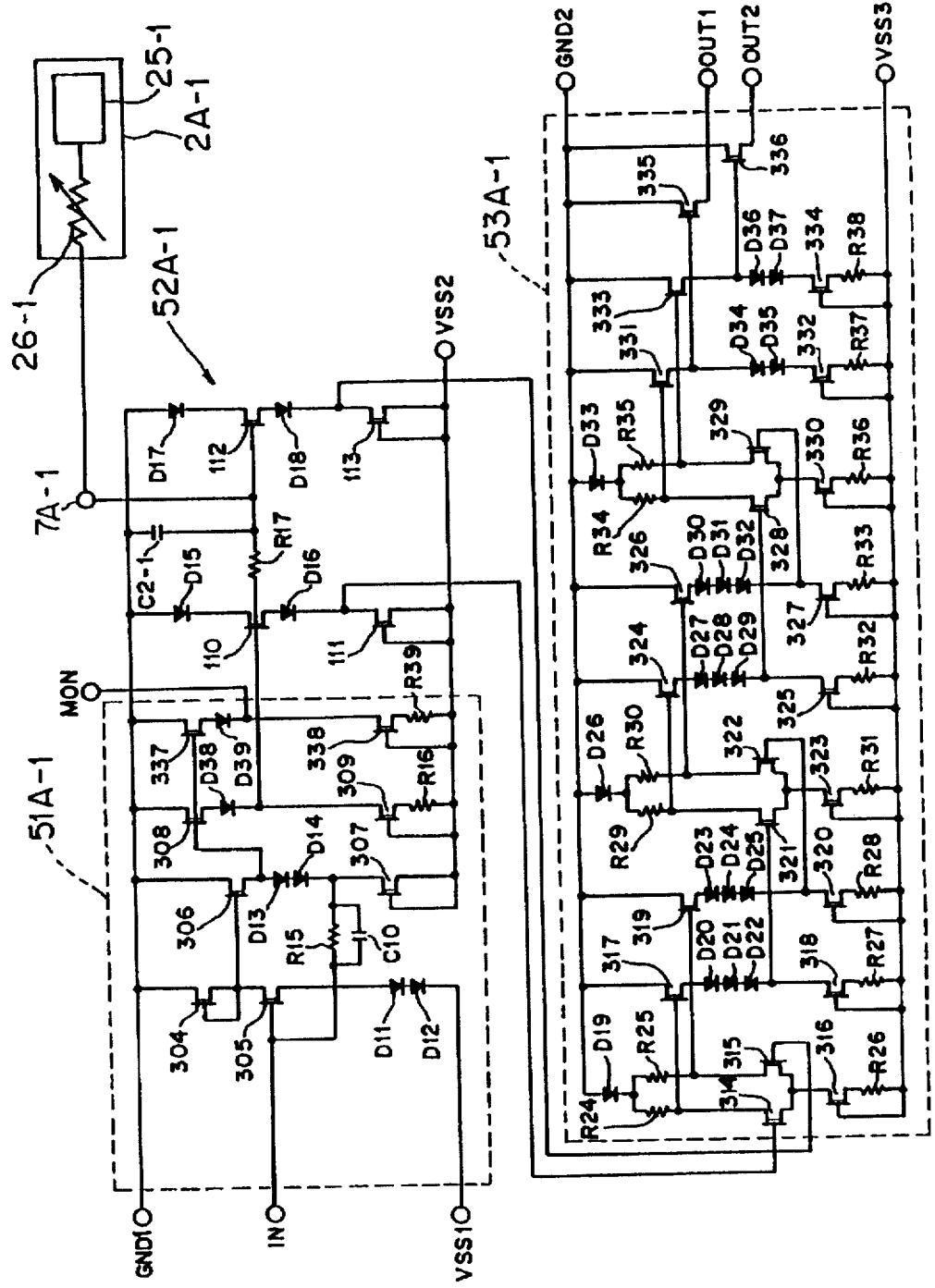
FIG. 9 shows an example of the mean value detecting integrated circuit according to the first embodiment of this invention formed with practical circuits.

FIG. 9 shows a diagram where, for example, the circuit unit 5A-1 among the circuit units 5A-1 . . . 5A-n shown in FIG. 7 is practically formed with actual circuits. As shown in FIG. 9, the preamplifier 51A-1 is formed with an FETs 304 through 309, 337, 338, diodes D11 through D14, D38, D39, resistors R15, E16, R39, and a capacitor C10. The mean value detecting circuit 52A-1 is formed with FETs 110 through 113, diodes D15 through D18, a resistor R17, at the same time the connecting terminal 7A-1 is connected to the capacitor C2-1 and the offset voltage adjusting circuit 2A-1, as described above.

Further, the limiter amplifier 53A-1 is basically a differential amplifier in three stages made up of a series connection of three amplifiers formed with pairs of FETs 314 and 315, 321 and 322,328 and 329, respectively, which amplifier is formed with the FETs 314 through 334, diodes D19 through D37 and resistors R24 through R38.

For a technique for constituting the preamplifier 51A-1 and the limiter amplifier 53A-1 as shown in FIG. 10 is well known in the art. Description of which is thus omitted here. Detailed description will be next made of an operation of the mean value detecting circuit 52A-1, which is an essential part of this invention, to regulate a potential error (an offset) between an input signal that is an output from the preamplifier 51a-1 and a mean value obtained from that input signal so as to correct the error. In the following description, FIG. 11 which is a simplified diagram of the mean value detecting circuit 52A-1 shown in FIG. 9, is referred to, for the sake of convenience.

Figure 11:
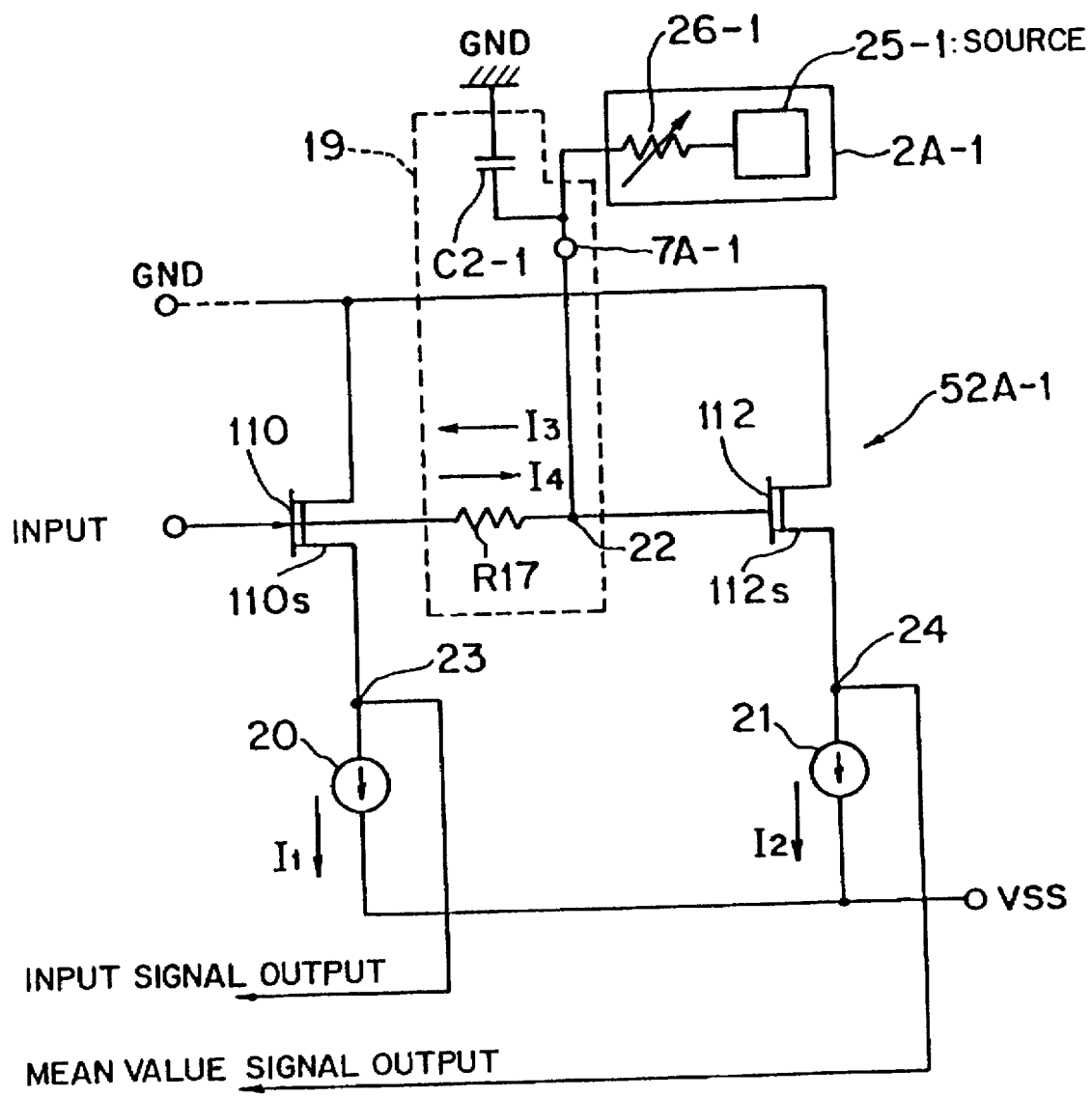
FIG. 11 is a diagram showing a structure of the mean value detecting circuit that is an essential part of the mean value integrated circuit according to the first embodiment of this invention.

The mean value detecting circuit 52A-1 shown in FIG. 11 includes the mean value detecting unit 19 made up of the capacitor C2-1 formed with a connection of the connecting terminal 7A-1 and the capacitor C2-1 and the resistor, an FET 110 (a first source follower circuit using a first FET) and an FET 112 (a second source follower circuit using a second FET). Further a constant-current source 20 is connected to a source 110s of the FET 110, while a constant-current source 21 is connected to a source 112s of the FET 112.

As will be seen from the following description, a circuit including these FETs 110, 112 constitutes an offset forcibly generating unit for forcibly generating an offset between an input signal and a mean value output.

Here, threshold voltages of the FETs 110 and 112, and currents of the constant-current power sources 20 and 21 (that is, a source follower current of both FETs 110, 112) are set to the same value, respectively, and gate widths of the FET 110 and the FET 112 are set to different values.

Since the offset voltage adjusting circuit 2A-1 is a circuit formed with a series connection of the power source 25-1 and the high resistor 26-1, the offset voltage adjusting circuit 2A-1 formed with the variable resistor 26-1 and the power source 25-1 is connected in parallel to the mean value detecting unit 19 at a point (the connecting terminal 7A-1) equivalent to a connecting point 22 of the resistor 17 and the capacitor C2-1. Incidentally, the power source 25-1 will be described later. GND designates a Ground (OV) terminal, and VSS designates a negative source for supplying a negative voltage.

With the above structure, the mean value detecting circuit 52A-1 shown in FIG. 11 forcibly generates an offset (a potential error) between a point 23 and a point 24 (that is, between an input signal and a mean value output), adjusting this offset by the variable resistor 26-1 of the offset voltage adjusting circuit 2A-1 so as to correct an error between an output of the input signal and the mean value output. The mean value detecting circuit 52A-1 stated above does not regulate an offset resulted from a slight difference between a current flowing through the source 110S of the FET 110 and a current flowing through the source 112S of the FET 112 as before, but adjusts an offset forcibly generated previously.

Next, the above operation will be described by way of a practical example.

A drain current Id of an FET is, in general, expressed by:

$$Id \propto Wg(Vgs-Vgh)^2 \quad (1)$$

where

Wg: a gate width;

Vth: a threshold voltage; and

Vgs: a voltage between a gate and a source.

If an integrated circuit is designed with an FET, the gate width Wg and the voltage Vgs between the gate and the source are, in general, only elements that the designer can intentionally change the values.

If current values I1, I2 of the respective constant-current power sources 20, 21 are set to the same values (I1=I2) as above to cause an equal current to flow through both source followers of the FET 110 and the FET 112, a wider gate width Wg allows a smaller voltage Vgs between the gate and the source.

Assuming that the variable resistor 26-1 of the offset voltage adjusting circuit 2A-1 is not connected to the connector terminal 7A-1, the gate voltages of the FET 110 and the FET 112 are equal. Consequently, if a gate width Wg (110) of the FET 110 is set wider than a gate width Wg (112) of the FET 112, a voltage of the voltage Vgs (110) between the gate and the source of the FET 110 becomes smaller. This leads to an increase in potential at a point 23 in FIG. 10, yielding an offset voltage where an output of the input signal has a potential higher than that of an output of the mean value. In this case, a circuit including the FETs 110 and 112 in which a gate width Wg (110) of the FET 110 is set wider than a gate width Wg (112) of the FET 112 constitutes an offset forcibly generating unit which forcibly generates an offset so that the input signal has a lower potential than the output signal of the mean value.

If the offset voltage adjusting circuit 2A-1 is formed with a series connection of the power source 25-1 having a higher potential than the point 22 and the variable resistor 26-1 and a resistance of the variable resistor 26-1 is varied, a current I3 flowing toward a side of the signal input may flow through the resistor R17. As a result, a potential of the point 23 is decreased so that an output of the input signal may have a potential equal to that of an output of the mean value, in other words, no error is generated between an output of the input signal and an output of the mean value.

Conversely, if the gate width Wg (112) of the FET 112 is set wider than the gate width Wg (110) of the FET 110, a voltage of the voltage Vgs (112) between the gate and source of the FET 112 is decreased. This results in an increase in potential at the point 24, leading to generation of an offset voltage where an output of the input signal has a lower potential than an output of the mean value. In this case, a circuit including the FETs 110 and 112 in which the gate width Wg (112) of the FET 112 is set wider than the gate width Wg (110) of the FET 110 constitutes an offset forcibly generating unit which forcibly generates an offset where the input signal has a higher potential than the output signal of the mean value.

If the offset voltage adjusting circuit 2A-1 is formed with a series connection of the power source 25-1 having a potential lower than the point 22 and the variable resistor 26-1, and a resistance of the variable resistor 26-1 is varied, this time, a current I4 may flow through the resistor R17 toward the output side. It is thus possible to adjust so that an output of the input signal has a potential equal to that of an output of the mean value by increasing a potential at the point 23, in other words, no error occurs between an output of the input signal and an output of the mean value.

As above, since the mean value detecting circuit (apparatus) 52A-1 above-described may forcibly generate an offset between an output of the input signal and an output of the mean value. This offset may be adjusted by the offset voltage adjusting circuit 2A-1 only by connecting the capacitor C2-1, which is an element constituting the means value detecting unit 19, and the offset voltage adjusting circuit 2A-1 in parallel to the mean value detecting unit 19 through the connecting terminal 7A-1. Accordingly, it becomes unnecessary to separately provide terminals or wirings for the capacitor C2-1 and the offset voltage adjusting circuit 2A-1 as before, whereby the mean value detecting circuit 52A-1 is allowed to have a simplified structure.

In particular, if this mean value detecting circuit 52A-1 is integrated as today, the chip necessary for the wiring may be largely reduced, the size and cost of the mean value detecting circuit 4A may be also reduced significantly.

It is also possible to forcibly generate either an offset voltage where an output of the input signal has a higher potential than an output of the mean value or an offset voltage where an output of the input signal has a lower potential than an output of the mean value so that it is sufficient to provide only the power source 25-1 having a higher or a lower potential than the connecting terminal 22 in the offset voltage adjusting circuit 2A-1. This is helpful to reduce a the size of the mean value detecting circuit 52A-1.

Particularly, under circumstances that this mean value detecting circuit 52A-1 is integrated as today, if it is necessary to provide two power supplies having a higher potential and a lower potential than the connecting point 22, respectively, a packaging of a substrate on which the mean value detecting circuit 52A-1 is mounted will be complicated. If it is possible to form a circuit of the mean value detecting circuit 52A-1 with either one of the power supplies 25, this will bring a great advantage.

In the above case, by setting threshold voltages of the respective FETs 110 and 112 at the same value, setting current values I1 and I2 of the respective constant-current sources 20 and 21 at the same value, and setting a gate width Wg (110) of the FET 110 and a gate width Wg (112) of the FET 112 at different values, an offset voltage is forcibly generated between the input signal and the mean value output. Even if the threshold values of the respective FETs 110 and 112 are set to the same value, the gate width Wg (110) and the gate width Wg (112) are set to the same value and the current value I1 of the constant-current source 20 and the current value I2 of the constant-current source 21 are set to different values, it is possible to forcibly generate an offset voltage between the input signal and the mean value output, as well.

As seen from the above equation (1), if the current Id becomes large, the voltage Vgs between the gate and the source of the FET becomes large. Conversely, if the current Id becomes small, the voltage Vgs between the gate and the source becomes small.

In consequence, if I1<I2, the voltage Vgs (112) between the gate and the source of the FET 110 becomes small and a potential at the point 23 increases in relative to the point 24 so that an offset voltage where an output of the input signal has a higher potential than an output of the mean value may be generated. In this case, an offset forcibly generating unit for forcibly generating an offset where the input signal has a higher potential than the mean value output is formed with a circuit in which the current value I2 of the constant-current source (the second power source) 21 connected to the source of the FET 112 is set larger than the current value I1 of the constant-current source (the first current source) 20 connected to the source of the FET 110.

Conversely, if I2<I1, the voltage Vgs (110) between the gate and the source of the FET 110 becomes large. This leads to a potential drop at the point 23 relative to the point 24 so that an offset where an output of the input signal has a lower potential than an output of the mean value may be generated. In other words, in this case, an offset forcibly generating unit which forcibly generates an offset where the input signal has a higher potential than the mean value output is formed with a circuit in which the current value I1 of the constant-current source (the first power source) 20 connected to the source of the FET 110 is set larger than the current value I2 of the constant power source (the second power source) 21 connected to the source of the FET 112.

Figure 12:
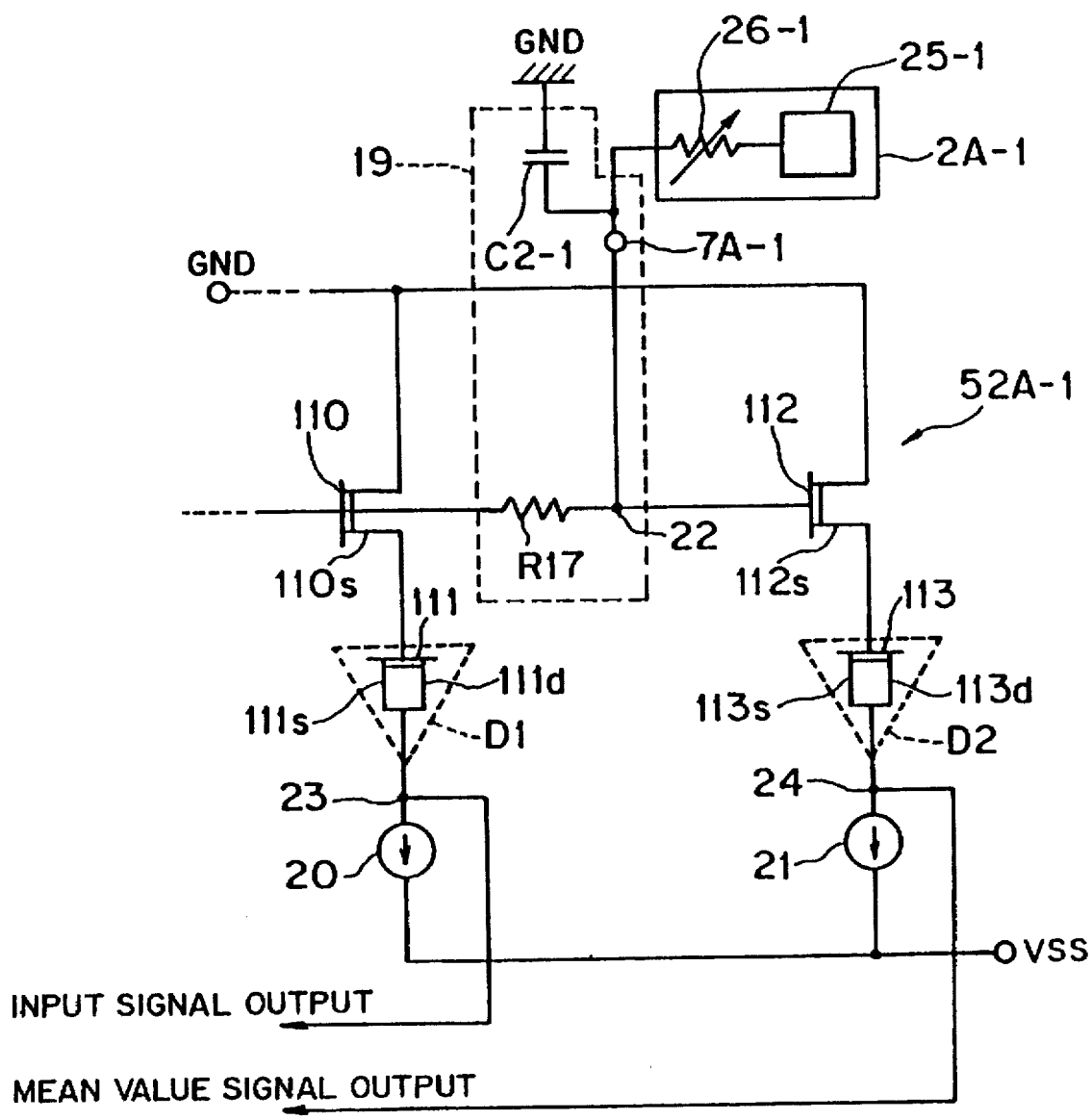
FIG. 12 is a diagram showing another structure of the mean value detecting circuit that is an essential part of the mean value detecting integrated circuit according to the first embodiment of this invention.

The above-mentioned mean value detecting circuit 52A-1 shown in FIG. 11 may have a structure shown in FIG. 12. In which case, the constant-current power source 20 is connected to a source 110s of the FET 110 via a diode D1 (a first diode) and the constant-current source 21 is connected to a source 112s of the FET 112 via a diode (a second diode) D2 in the mean value detecting circuit 52A-1 shown in FIG. 12, dissimilarly to the mean value detecting circuit 52A-1 shown in FIG. 11.

The above-mentioned diode D1 is formed with a short-circuit connection between a drain 111d and a source 111s of the FET 111. The above-mentioned diode D2 is formed with a short-circuit connection between a drain 113d and a source 113s of the FET 113.

In this case, the threshold values and the gate widths of the FET 110 and FET 112 are set to the same value, respectively, currents of the constant-current sources 20 and 21 are set to the same value, and the gate width Wg (D1) of the diode D1 and the gate width Wg (D2) of the diode D2 are set to different values. Whereby, it is possible to forcibly generate an offset voltage between the input signal and the output signal of the mean value. This operation will be next described in detail.

Figure 13:
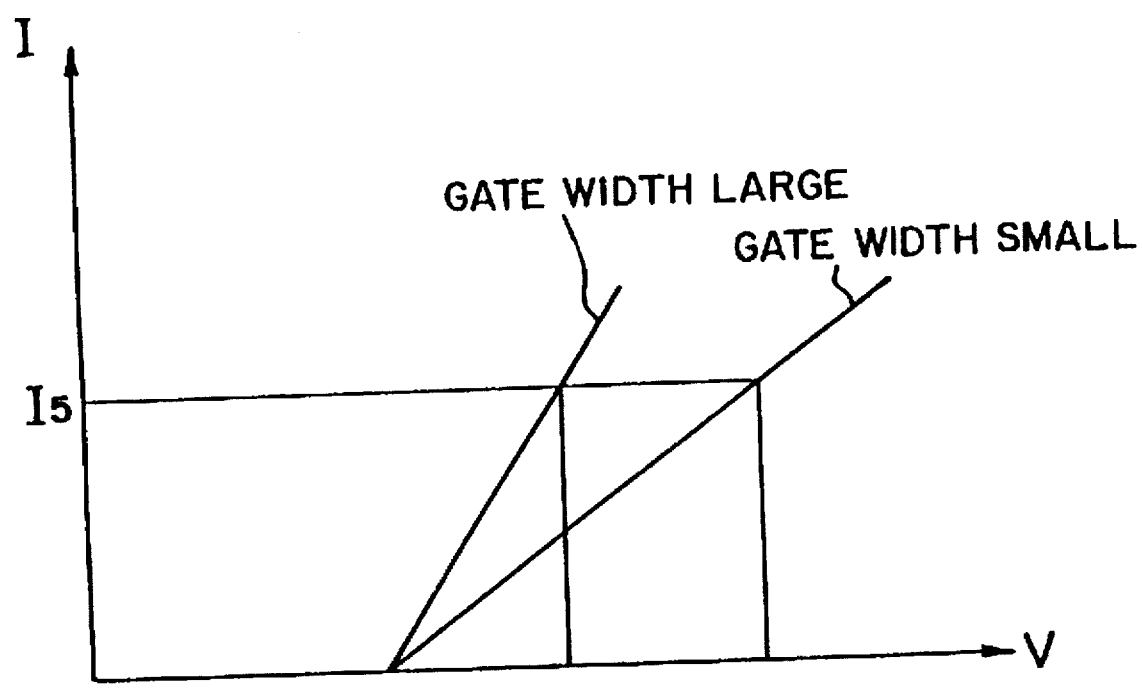
FIG. 13 is a graph showing a diode characteristic when a diode is formed with an FET.

In the case where the diode D1 (D2) is formed with the FET 111 (113) as above, a diode characteristic [V (voltage) –I (current) characteristic] of the diode D1 (D2) is shown in FIG. 13. This diode D1 (D2) yields a smaller level-shifting (-increasing or -decreasing) voltage if the same current IS flows therethrough since a wider gate width Wg has a smaller internal resistance.

Therefore, if the gate width Wg (D1) of the diode D1>the gate width Wg (D2) of the diode D2, a potential at the point 23 increases relative to the point 24, an offset where an output of the input signal has a higher potential than an output of the mean value thus yields. Conversely, if Wg (D1)<Wg (D2), a potential at the point 23 decreases relative to the point 24, an offset where an output of the input signal has a lower potential than an output of the mean value thus yields.

In this case, an offset forcibly generating unit which forcibly generates an offset where the input signal has a higher potential than an output of the mean value or the input signal has a lower potential than an output of the mean value is formed with a circuit in which the gate width Wg (D1) of the diode D1 formed with the FET 111 is set wider than the gate width Wg (D2) of the diode D2 formed with the FET 113, or the gate width Wg (D2) of the diode D2 formed with the FET 113 is set wider than the gate width Wg (D1) of the diode D1 formed with the FET 111.

It is sufficient to employ either one of the sources 25-1 having a higher potential or a lower potential than the connecting point 22 depending on an offset forcibly generated as above as a source used for the offset voltage adjusting circuit 2A-1. If an offset where an output of the input signal has a higher potential than an output of the mean value is generated, the source 25-1 having a higher potential than the connecting point 22 is employed. Conversely, if an offset where an output of the input signal is a lower potential than an output of the mean value is generated, the source 25-1 having a lower potential than the connecting point 22 is employed, thereby adjusting a current flowing through the resistor R17 so as to regulate an offset of the mean value output signal.

As above, by setting the gate width Wg (D1) of the diode D1 made up of the FET 111 and the gate width Wg (D2) of the diode D2 made up of the FET 113 are set differently as Wg (D1)<Wg (D2) or Wg (D2)<Wg (D1), it is also possible to forcibly generate an offset between an output of the input signal and an output of the mean value in the mean value detecting circuit (apparatus) shown in FIG. 12. As this, the mean value detecting circuit (apparatus) shown in FIG. 12 may give the same effect or advantage as the mean value detecting circuit 52A-1 shown in FIG. 11.

Figure 14:
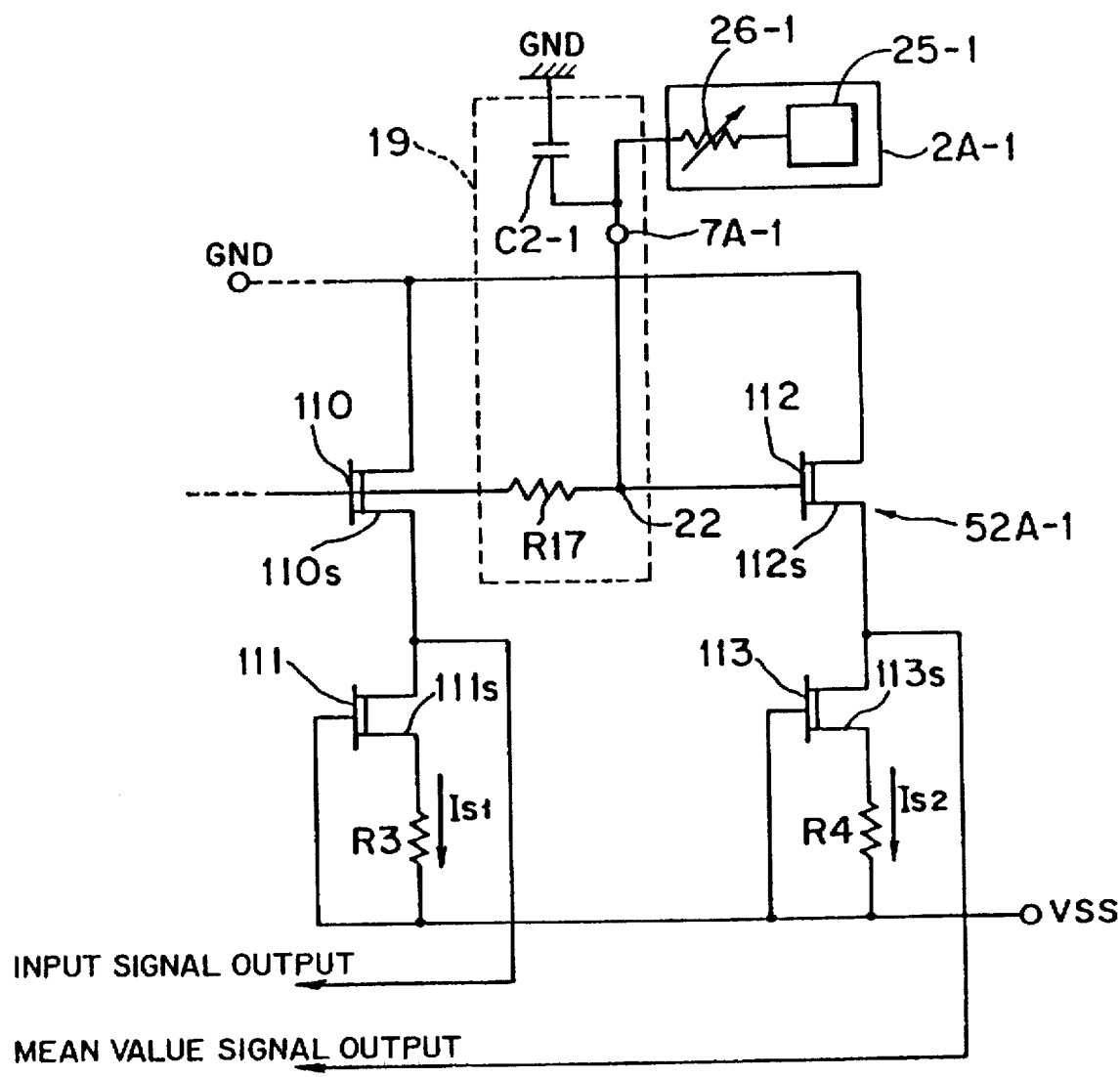
FIG. 14 is a diagram showing still another structure of the mean value detecting circuit that is an essential part of the mean value detecting integrated circuit according to the first embodiment of this invention.

The mean value detecting circuit 52A-1 above-mentioned may have a structure shown in FIG. 14. The mean value detecting circuit 52A-1 shown in FIG. 14 is equivalent to a circuit in which the constant-current source 20 in the mean value detecting circuit 52A-1 shown in FIG. 11 is formed with an FET 111 (a third FET) and a resistor (a first resistor) R3 connected to a source 111s of this FET 111 and the constant-current source 21 shown in FIG. 11 is formed with an FET 113 (a fourth FET) and a resistor (a second resistor) R4 connected to a source 113s of this FET 113.

The mean value detecting circuit 52A-1 shown in FIG. 14 may forcibly generate an offset previously between the input signal and the mean value output signal as same as the mean value detecting circuit having been described with reference to FIG. 11 by setting source follower currents Is1 and Is2

(currents flowing through the resistor R3 and R4, respectively) of the respective FETs 111 and 113 at different values.

There are two methods to set the source follower currents Is1 and Is2 of the respective FETs 111 and 113 to different values, as below:

(1) A method in which a gate width Wg (111) of the FET 111 and a gate width Wg (113) of the FET 113 are set at different values;

In this case, the gate width Wg (113) of the FET 113 is assumed to be N times (where N is a natural number) the gate width Wg (111) of the FET 111;

$$Wg\ (113)=N\cdot Wg\ (111)$$

In order to be the source follower current Is2 of the FET 113 N times the source follower current Is1 of the FET 111, that is:

$$Is2=N\cdot Is1,$$

it is sufficient to set the voltage Vgs (113) between a gate and a source of the FET 113 and a voltage Vgs (113) between a gate and a source of the FET 115 to the same value, from the above equation (1).

Now, since $$Vgs\ (111)=Is1\cdot R3,\ \text{and}$$

$$Vgs\ (113)=Is2\cdot R4,$$

if $$Vgs\ (113)=Vgs\ (111),$$

R4 becomes;

$$\begin{aligned}R4 &= Is1\cdot R3/Is2\\ &= Is1\cdot R3/(N\cdot Is1)\\ &= R3/N.\end{aligned}$$

Therefore, $$N=R3/R4.$$

If the gate width Wgs (113) of the FET 113 is set N (R3/R4) times the gate width Wgs (111) of the FET 111 as above, Is1<Is2 from Is2=N·Is1. As a result, a voltage between the gate and the source of the FET drops.

In other words, a potential at the point 23 increases relative to the point 24. Whereby, it is possible to forcibly generate an offset voltage where the input signal has a higher potential than the mean value output signal between the input signal and the mean value output signal. In this case, an offset forcibly generating unit is formed with a circuit in which the constant-current source having been described with reference to FIG. 11 is made up of the FET 111 and the resistor R3 connected to the source 111s of the FET 111, the constant-current source also having been described with reference to FIG. 11 is made up of the FET 113 and the resistor R4 connected to the source 113s of the FET 113, where the gate width Wgs (111) of the FET 111 is set N times the gate width Wgs (113) of the FET 113 so that the input signal has a higher potential than the mean value output.

Conversely, when N is determined where Wg (111)= N·Wg (113) and Is1=N·Is2, N becomes R3/R4. This time, if the gate width Wgs (111) of the FET 111 is set to N (R3/R4) times the gate Wgs (113) of the FET 113, Is2<Is1, thus a voltage between a gate and a source of the FET 112 drops.

In other words, a potential at the point 23 decrease relative to the point 24. As a result, it is possible to forcibly generate previously an offset voltage where the input signal has a lower potential than the mean value output signal between the input signal and the mean value output signal. In this case, an offset forcibly generating circuit is formed with a circuit in which the constant-current source 20 having been described with reference to FIG. 11 is made up of the FET 111 and the resistor R3 connected to the source 111s of the FET 111 and the constant-current source 21 also having been described with reference to FIG. 11 is made up of the FET 113 and the resistor R4 connected to the source 113s of the FET 113, where the gate width Wgs (113) of the FET 113 is set N (R3/R4) times the gate width Wgs (111) of the FET 111 so that the input signal has a lower potential than the mean value output.

(2) A method in which a resistance of the resistor R3 and a resistance of the resistor R4 are set at different values If a power source is formed with an FET and a resistor, Vgs=Id·R where Vgs is a voltage between a gate and a source of the FET, a resistance is R and a current flowing through the resistor is Id. When this is substituted in the above equation (1), Id is given as:

$$Id\approx\tfrac{1}{2}Wg-Vth/R+(\tfrac{1}{2})\times[(2Vth/R-1/Wg)^2-4Vth^2/R^2]^{1/2}$$

Therefore, if R4<R3, a source follower current Is1 of the FET 114 decreases (that is, Is1<Is2). Conversely, if RB<R4, a source follower current Is2 of the FET 115 decreases (that is, Is2<Is1). As this, the source follower currents Is1 and Is2 of the respective FET 114 and 115 may set to different values, as same as above. It is thus possible to forcibly generate an offset voltage where the input signal has a higher potential than the mean value output signal, or conversely, the input signal has a lower potential than the mean value output signal previously between the input signal and the mean value output signal, as well as the above case.

In this case, an offset forcibly generating unit is formed with a circuit in which the constant-current source 20 having been described with reference to FIG. 11 is made up of the FET and the resistor R3 connected to a source 111s of the FET 111, the constant-current source 21 also having been described with reference to FIG. 11 is made up of the FET 113 and the resistor R4 connected to a source 113s of the FET 113, where a value of the resistor R3 is set at a larger value than that of the resistor R4 so that the input signal has a higher potential than the mean value output or a value of the resistor R4 is set to a larger value than that of the resistor R3 so that the input signal has a lower potential than the mean value output.

As above, the constant-current sources 20 and 21 in the mean value detecting circuit 52A-1 shown in FIG. 10 is formed with the FET 111 and the resistor R3, and the FET 113 and the resistor R4, respectively, currents flowing through the sources 111s and 113s of the respective FETs 111 and 113 (currents flowing through the respective resistors R3 and R4) are set at different values, as above, whereby the mean value detecting circuit (apparatus) 52A-1 shown in FIG. 13 may forcibly generate an offset between an output of the input signal and an output of the mean value. The mean value detecting circuit 52A-1 shown in FIG. 13 may give the same effect and advantage as the mean value detecting circuit 52A-1 shown in FIG. 10. In addition to these, it is possible to quite readily accomplish the respective constant-current sources 20 and 21 with practical circuits.

Figure 15:
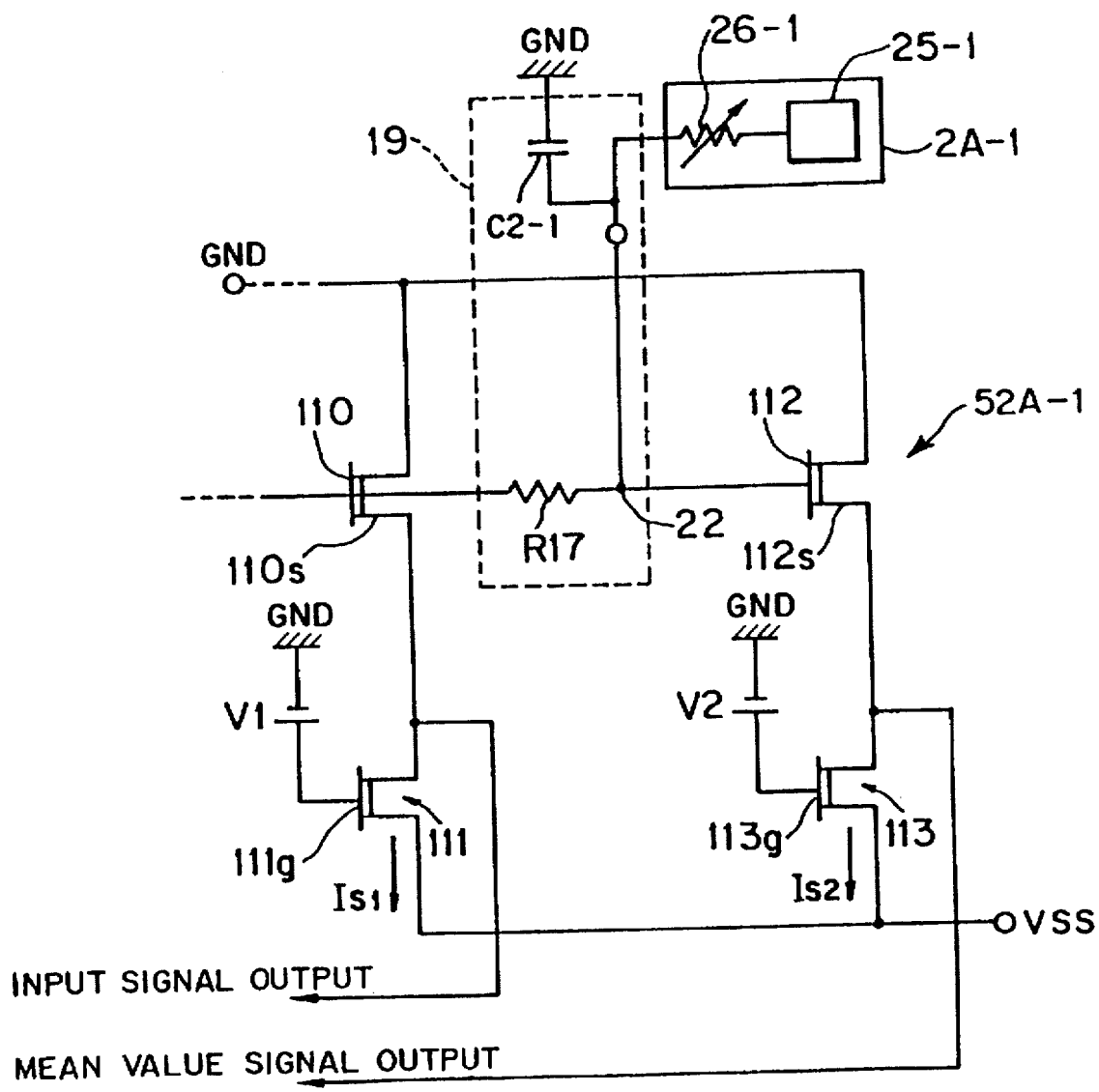
FIG. 15 is a diagram showing still another structure of the mean value detecting circuit that is an essential part of the mean value detecting integrated circuit according to the first embodiment of this invention.

Finally, the above mean value detecting circuit 52A-1 may have a structure shown in FIG. 15. The mean value detecting circuit 52A-1 shown in FIG. 15 is equivalent to a circuit in which the constant-current source 20 in the mean value detecting circuit 52A-1 shown in FIG. 11 is made up of an FET 111 and a source V1 connected to a gate 111g of the FET 111 and the constant-current source 21 also shown in FIG. 11 is made up of an FET 113 and a source V2 connected to a gate 113g of the FET 113.

In this case, voltages Vgs (111), Vgs (113) between gates and sources of the FET 111 and the FET 113 are directly changed by the sources V1 and V2, respectively, thereby setting source follower currents Is1 and Is2 of the respective FETs 111 and 113 at different values.

More specifically, if V1<V2, Is1<Is2. A voltage Vgs (110) between the gate and the source of the FET 110 thus decreases, which leads to an increase in potential at the point 23 relative to the point 24. It is therefore possible to forcibly generate an offset where an output of the input signal has a higher potential than an output of the mean value, previously.

In this case, an offset forcibly forming unit is formed with a circuit in which the constant-current source 20 having been described with reference to FIG. 11 is made up of the FET 111 and the constant-current source 21 having been also described with reference to FIG. 11 is made up of the FET 113, where a gate potential (V2) of the FET 113 is set to a larger value than a gate potential (V1) of the FET 111 so that the input signal has a higher potential than the mean value output.

Conversely, if V2<V1, Is2<Is1. A voltage Vgs (112) between a gate and a source of the FET 112 thus decreases. This time, a potential at the point 23 drops in relative to the point 24. It is therefore to forcibly generate an offset where an output of the input signal has a lower potential than an output of the mean value, previously.

In this case, an offset forcibly generating unit is formed with a circuit in which the constant-current source 20 having been described with reference to FIG. 11 is made up of the FET 111, the constant-current source 21 having been also described with reference to FIG. 11 is made up of the FET 113, where the gate potential (V1) of the FET 111 is set to a larger value than that of the gate potential (V2) of the FET 113 so that the input signal has a lower potential than the mean value output.

As above, the constant-current sources 20 and 21 in FIG. 11 are made up of the FET 111 and the source V1, and the FET 113 and the source V2, respectively, and source follower currents Is1 and Is2 of the respective FETs 111 and 113 are set to different value by the sources V1 and V2, respectively, whereby the mean value detecting circuit 52A-1 shown in FIG. 15 may forcibly generate an offset between the input signal and the mean value output. The mean value detecting circuit 52A-1 shown in FIG. 15 may give the same effect or advantage as the mean value detecting circuit 52A-1 shown in FIG. 11. In addition to this, it is also possible to quite readily accomplish the above current sources 20 and 21 with practical circuits.

Incidentally, the structures of the above mean value detecting circuits 52A-1 shown in FIGS. 11 through 15, respectively, may be combined with each other. As shown in FIGS. 11 through 15, the offset voltage adjusting circuit 2A-1 is formed with a series circuit of the high resistance 26-1 and the source 25-1 in order to readily accomplish it with practical circuits, thereby adjusting a current flowing through the resistor R17 that is an element constituting the mean value detecting unit 19. Alternatively, it is possible that the offset voltage adjusting circuit 2A-1 is formed with a current source, and connected in parallel to the mean value detecting unit 19 at a point (the connecting terminal 7A-1) equivalent to the connecting point between the resistor R17 and the capacitor C2-1 of the mean value detecting unit 19, thereby directly adjusting the current flowing through the resistor R17.

To the connecting terminal 7A-1 shown in each of the FIGS. 11 through 15, the offset voltage adjusting circuit 2A-1 is connected. Instead of the offset adjusting circuit 2A-1, it is possible to connect a compensating circuit having the same temperature, source voltage fluctuation characteristic as the preamplifier 51A-1 (refer to FIG. 7) to the connecting terminal 7A-1 via a resistor. More specifically, a compensating circuit having the same temperature, source voltage fluctuation characteristic as the preamplifier (a front-stage circuit) 51A-1 performing a necessary process on the input signal is connected in parallel to the mean value detecting unit 19 at the connecting terminal 7A-1 which is a point equivalent to the connecting point 22 between the resistor R17 and the capacitor (a capacitance) C2-1 in the mean value detecting unit 19 via a resistor.

In the above case, it is possible, by virtue of the above compensating circuit, to regulate an offset forcibly generated between the input signal and the mean value output as well as the above-stated offset voltage adjusting circuit 2A-1, and compensate an error (a fluctuation) of the input signal to the mean value detecting circuit 52A-1 affected when a temperature or source voltage characteristic of the preamplifier 51A-1 fluctuates.

Figure 16:
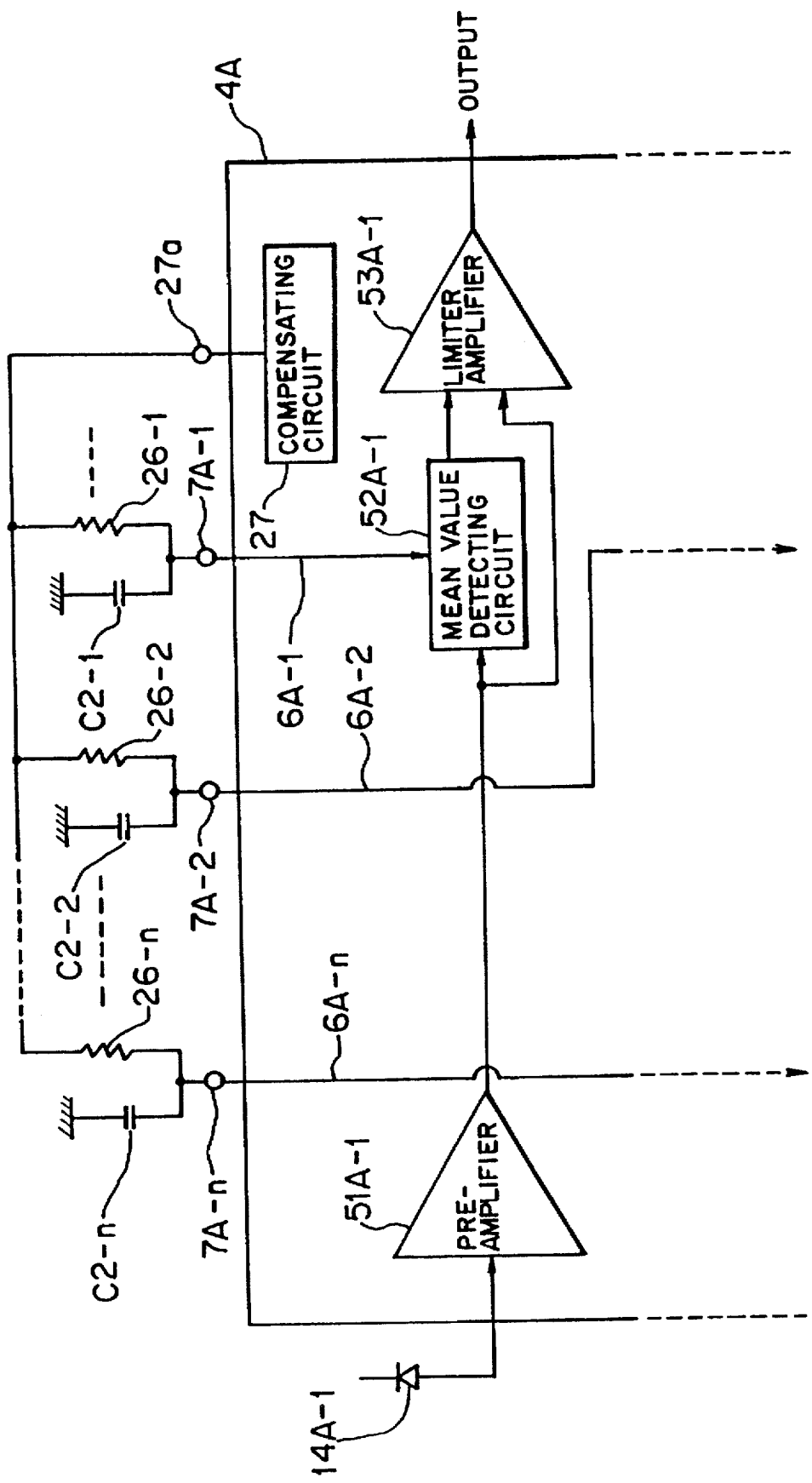
FIG. 16 is a block diagram showing a structure of the mean value detecting integrated circuit with a compensating circuit according to the first embodiment of this invention.

FIG. 16 is a block diagram showing a structure of the mean value detecting integrated circuit 4A shown in FIG. 7 provided with a compensating circuit as described above shown in FIG. 16. As shown in FIG. 16, the mean value detecting integrated circuit 4A has a compensating circuit 27 having the same temperature, source voltage characteristic as a preamplifier 51A-1 and an output terminal 27a for outputting an output from the compensating circuit 27. The compensating circuit 27 is connected to each of connecting terminals 7A-1, . . . 7A-n provided at ends of respective strip lines 6A-1, . . . 6A-n via this output terminal 27a and respective resistors 26-1, . . . 26-n.

Each of the connecting terminals 7A-1, . . . 7A-n is connected to the output terminal 27a for the compensating circuit 27 to be formed as an input terminal for receiving an output from the compensating circuit 27.

The mean value detecting integrated circuit 4A with the above structure receives an output fed from the compensating circuit 27 via the respective resistors 26-1, . . . 26-n through the respective connecting terminals 7A-1, . . . 7A-n provided at ends of the respective strip lines 6A-1, . . . 6A-n, thereby adjusting an offset forcibly generated between the input signal and the mean value output in each of the mean value detecting circuits 52A-1, . . . 52A-n, as well as the offset voltage adjusting circuit 2A-1 having been described with reference to FIGS. 11 through 15, and compensating an error (a fluctuation) of the input signal to the mean value detecting circuit 52A-1, . . . 52A-n affected when the temperature, source voltage characteristic of the preamplifier 51A-1, . . . 51A-n changes. Incidentally, the operation of each of the mean value detecting circuits 52A-1, . . . 52A-n has been described with reference to FIGS. 11 through 15, no description of which is thus made here.

As this, the mean value detecting integrated circuit 4A shown in FIG. 16 may compensate an error occurring in the mean value detection due to fluctuations in temperature or source voltage by using an output of the compensating circuit 27 when a mean value of the signal is detected in the mean value detecting circuit 52A-1, . . . 52A-n. This mean value detecting integrated circuit 4A may advantageously provide a more accurate mean value. Meanwhile, it is possible to dispose the compensating circuit 27 outside the mean value detecting integrated circuit 4A to distribute its output to each of the mean value detecting circuits 52A-1, . . . 52A-n.

(c) Description of Second Embodiment of this Invention

Figure 17:
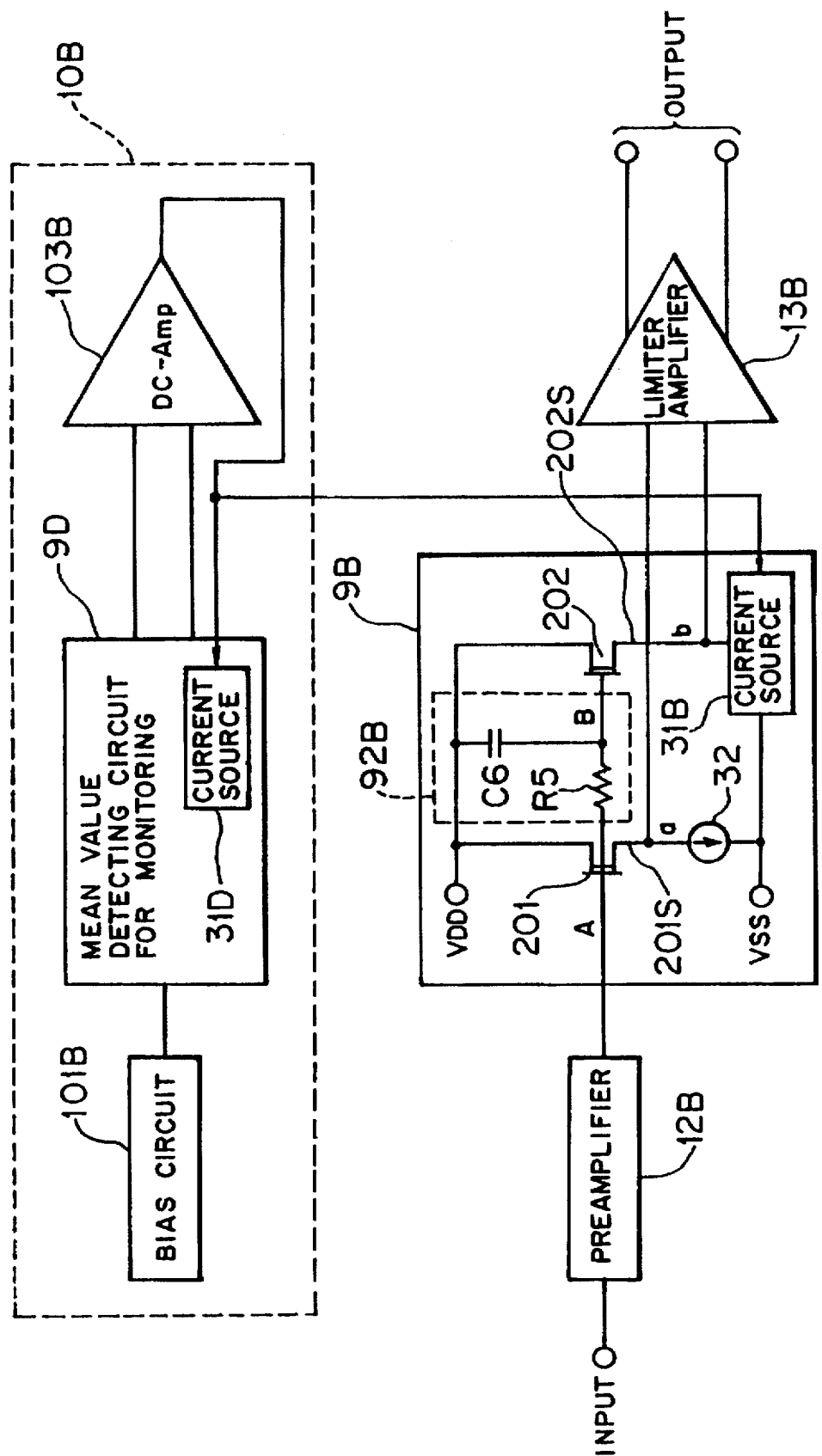
FIG. 17 is a block diagram showing a structure of a mean value detecting apparatus according to a second embodiment of this invention.

FIG. 17 is a block diagram showing a structure of a mean value detecting apparatus as a second embodiment of this invention. The mean value detecting apparatus shown in FIG. 17 has a preamplifier (a pre-circuit) 12B, a mean value detecting circuit 9B, a limiter amplifier (a differential amplifier circuit) 13B and a monitor circuit 10B.

The preamplifier 12B amplifies an input signal to a desired signal level. The mean value detecting circuit 9B detects a mean value of the signal amplified by the preamplifier 12B. The limiter amplifier 13B receives an output of the preamplifier 12B and a mean value output from the mean value detecting circuit 9B at differential inputs and outputs them.

The above mean value detecting circuit 9B includes a mean value detecting unit 92B formed with a resistor R5 for detecting a mean value of an output of the preamplifier 12B and a capacitor (a capacitance) C6, an FET 201 (a first source follower circuit using a first FET), an FET 202 (a second source follower circuit using a second FET), and a current source (a control circuit) 31B connected to a source 202s of the FET 202.

The FET 201 and the FET 202 output the input signal and the mean value detected by the mean value detecting unit 92B as signals in two systems, respectively. The current source 31B uses a feedback signal from a DC amplifier (a DC-Amp) 103B in the monitor circuit 10B described later to control the source follower current of the FET 202 so as to cancel a potential difference generated at the resistor R5 due to a leak current ILEAK from the FET 202 at an input point b of the limiter amplifier 13B. Meanwhile, a constant-current source 30 connected to a source 201s of the FET 201 is for keeping the source follower current flowing to a source of the FET 201 at constant.

As shown in FIG. 17, the monitor circuit 10B is provided to cancel a potential difference generated at the resistor R5 due to the leak current ILEAK from the FET 202 at the input point b of the limiter amplifier 13B in the upper stage of the preamplifier 12B, the mean value detecting circuit 9B and the limiter amplifier 13B.

The monitor circuit 10B has a bias circuit 101B, a mean value detecting circuit for monitoring 9D and a DC amplifier (a comparing circuit of a direct-current amplifier type) 103B. The bias circuit 10B is configured with the same circuit as the above-mentioned preamplifier 12B. The mean value detecting circuit for monitoring 9D receives an output from the bias circuit 101B as an input signal, and has the same structure as the above-mentioned mean value detecting circuit 9B. The DC amplifier 103B compares potentials of the input signal and output signal of the mean value detecting circuit for monitoring 9D and feeds back this potential difference (deviation information) to the mean value detecting circuit for monitoring 9D as a feedback signal.

With the monitor circuit 10B having the above structure, the mean value detecting circuit for monitoring 9D detects a mean value of the output signal from the bias circuit 101B. The DC amplifier 103B compares a potential of the input signal (that is, an output signal of the bias circuit 101B) with a potential of the mean value output signal of the mean value detecting circuit 9D and feeds back the potential difference to the current source 31D of the mean value detecting circuit 9D and the current source 31B of the mean value detecting circuit 9B as a feedback signal.

In consequence, each of the current sources (control circuits) 31B and 31B may regulate (control) the source follower current of each of the FETs 202 of the mean value detecting circuits 9B and 9D, thereby cancelling a potential difference generated at the resistor R5 due to the leak current ILEAK from each of the FETs 202. It is therefore possible to prevent the DC amplifier 103B and the limiter amplifier 13B from falsely operating due to a potential error in the input and output signal of each of the mean value detecting circuits 9B and 9D.

Next, the above operation will be made in detail with reference to FIG. 18.

Figure 18:
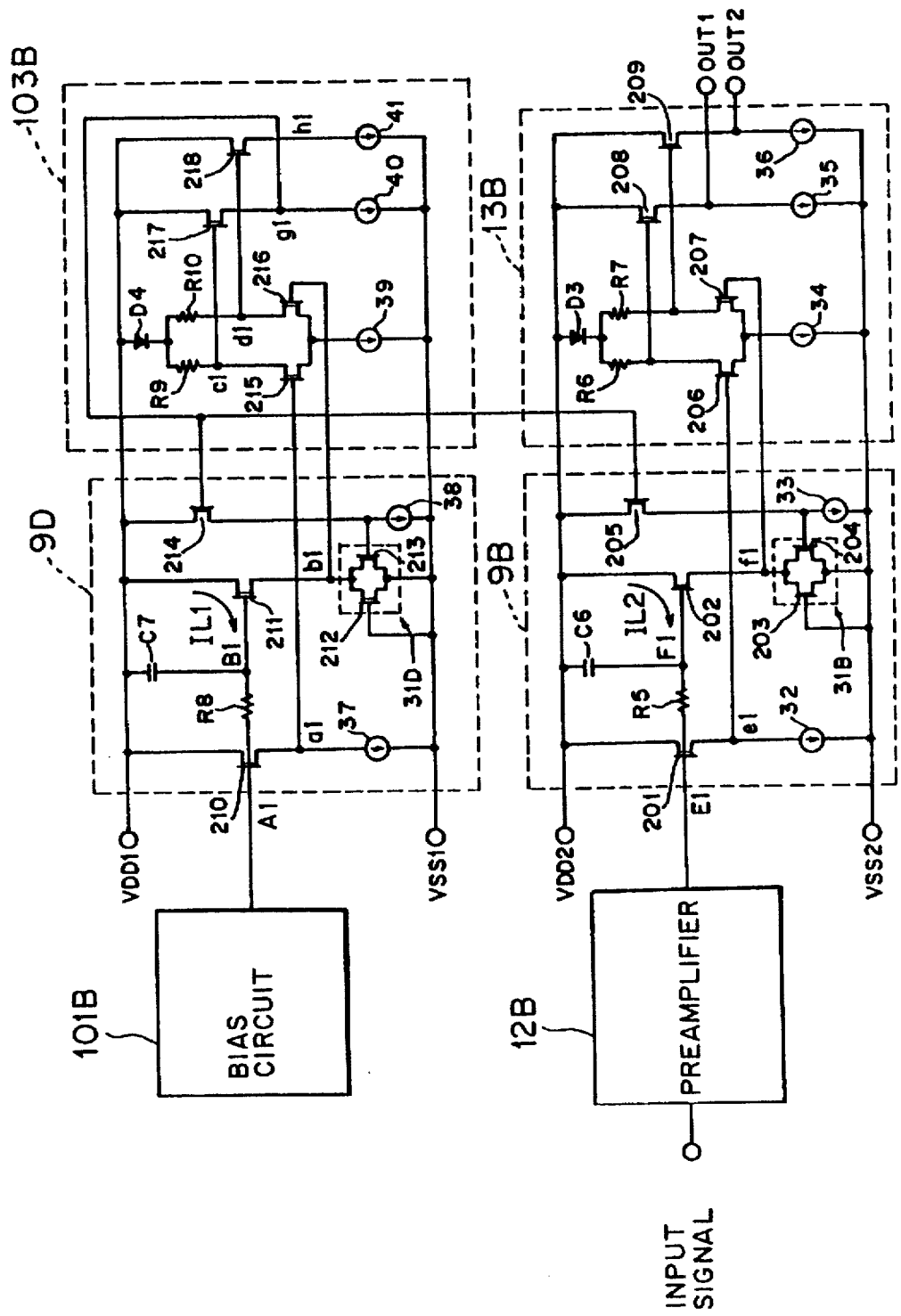
FIG. 18 shows an example of the mean value detecting apparatus according to the second embodiment of this invention whose essential part is formed with practical circuits.

The mean value detecting apparatus shown in FIG. 18 is an example where each of the mean value detecting circuits 9B and 9D, the DC amplifier 103B and the limiter amplifier 13B shown in FIG. 17 are formed as practical circuits.

As shown in FIG. 18, the mean value detecting circuit for monitoring 9D and the DC amplifier 103B have the same structures of the mean value detecting circuit 9B and the limiter amplifier 13B, respectively.

In FIG. 18, current sources 31B and 31D of the respective mean value detecting circuits 9B and 9D having been described with reference to FIG. 17 are formed with connections of drains and sources of the FET 203 and FET 204 to each other, and connections of drains and sources of the FET 212 and FET 213 to each other, respectively.

The DC amplifier 103B is made up of an FET 215 and an FET 216 in the form of a differential pair, resistors R9 and R10, a diode D4 connected to these diodes R9 and R10, an FET 217 whose gate is connected to a drain of the FET 215, an FET 218 whose gate is connected to a drain of the FET 216 and a constant-current sources 39 through 41.

Similarly, the limiter amplifier 13B is made up of an FET 206 and FET 207 in the form of a differential pair, resistors R6 and R7, a diode D3 connected to these resistors R6 and R7, an FET 208 whose gate is connected to a drain of the FET 206, an FET 209 whose gate is connected to a drain of the FET 207 and constant-current sources 34 through 36. The above structures of the DC amplifier 103B and the limiter amplifier 13B are well known in the art, no description of which is thus made here.

In the mean value detecting apparatus shown in FIG. 18, a potential difference $\Delta V1$ ($\Delta V1=IL1 \times R8$) between a point A1 and a point B1 having been generated due to a leak current IL1 from the FET 211 in the mean value detecting circuit 9D for monitoring and the resistor R8 for detecting a mean value becomes a potential difference $\Delta V1$ between a point a1 and a point b1 after passing through source followers of the FET 210 and the FET 211.

Similarly, in the mean value detecting circuit 9B, a potential difference $\Delta V2$ ($\Delta V2=IL2 \times R5$) is generated between a point E1 and a point F1 due to a leak current IL2 from the FET 202 and the resistor R5 for detecting a mean value. This potential difference $\Delta V2$ becomes a potential difference $\Delta V2$ between a point e1 and a point f1 after passing through source followers of the FET 201 and the FET 202.

Since the same elements are used in the mean value detecting circuits 9D and 9B in the upper and lower stage, the potential difference $\Delta V1$ between the point a1 and the point b1 and the potential difference $\Delta V2$ between the point e1 and the point f1 are equal($\Delta V1=\Delta V2$).

Now, description will be first made of an operation to cancel the potential difference $\Delta V1$ generated due to the leak current IL1 from the FET 211 in the mean value detecting circuit 9D.

Assuming now that a potential at the point b1 is higher than a potential at the point a1 by $\Delta V1$. On this occasion, signals are inputted to each of gate potentials (potentials at the point a1 and the point b1) of respective gates of the FET 215 and the FET 216 which are a differential pair in the DC amplifier 103B in the rear stage under a condition where the point b1 has a potential higher than that of the point a1 by $\Delta V$.

Whereupon a potential at a point c1 in the DC amplifier 103B increases by this potential difference $\Delta V1$. As a result, a potential at a point d1 decreases. Further, a potential at a point g1 in the a source follower of the FET 217 also increases because the potential at the point c1 has increased, while a potential at a point h1 in a source follower of the FET 218 decreases because a potential at the point d1 has decreased, likewise.

Since the point g1 leads to a gate of the source follower of the FET 214, a potential at the gate of the FET 214 increases, which causes an increase in gate potential of the FET 213. Accordingly, a voltage Vgs between a gate and a source of the FET 213 increases, thus a source follower current flowing to the source of the FET 213 increases so that a potential at the point b1 whose potential is higher than the point a1 by a potential difference $\Delta V1$ may be decreased.

As above, it is possible to cancel the potential difference $\Delta V1$ being generated due to the leak current IL1 from the FET 211.

From a fact that the potential difference $\Delta V2$ being generated due to the leak current from the FET 202 in the mean value detecting circuit 9B is equal to $\Delta V1$ ($\Delta V2= \Delta V1$), if the point g1 is connected to the gate of the FET 205 in the mean value detecting circuit 9B, a source follower current flowing to the source of the FET 211 increases to decrease a potential at a point f1, thereby cancelling a potential difference $\Delta V2$ being generated due to a leak current IL2 from the FET 202, simultaneously. In contrast with the above case, if a potential at the point b1 is lower than a potential at the point a1, it is possible to cancel the potential difference $\Delta V2$ likewise in an inverse operation.

As above, by feeding back the potential difference (deviation information) $\Delta V1$ from the DC amplifier 103B in the monitor circuit 10B to control the source follower current of the FET 204 which is an element constituting the current source (a control circuit) 31B, the mean value detecting apparatus of this invention may cancel the potential difference $\Delta V2$ generated due to the leak current IL2 from the FET 202 and the resistor R5 at the input point (the point f1) of the limiter amplifier 13B. This technique is effective to accurately detect a mean value of an input signal and improve a performance of the mean value detecting apparatus.

Since the bias circuit 101B is formed with the same circuit as the preamplifier 12B, an error potential (deviation information) as a feedback signal obtained by the mean value detecting circuit for monitoring 9D is a value equal to or approximate to an error potential generated due to the leak current from the FET 202 in the mean value detecting circuit 9B so that this error potential may be effectively cancelled.

According to this embodiment, the bias circuit 101B is formed with the same circuit as the preamplifier 12B. The bias circuit 101B may be formed with a circuit (having the same structure as the preamplifier 12B) having the same temperature, source voltage fluctuation characteristic as the preamplifier 12B.

Figure 19:
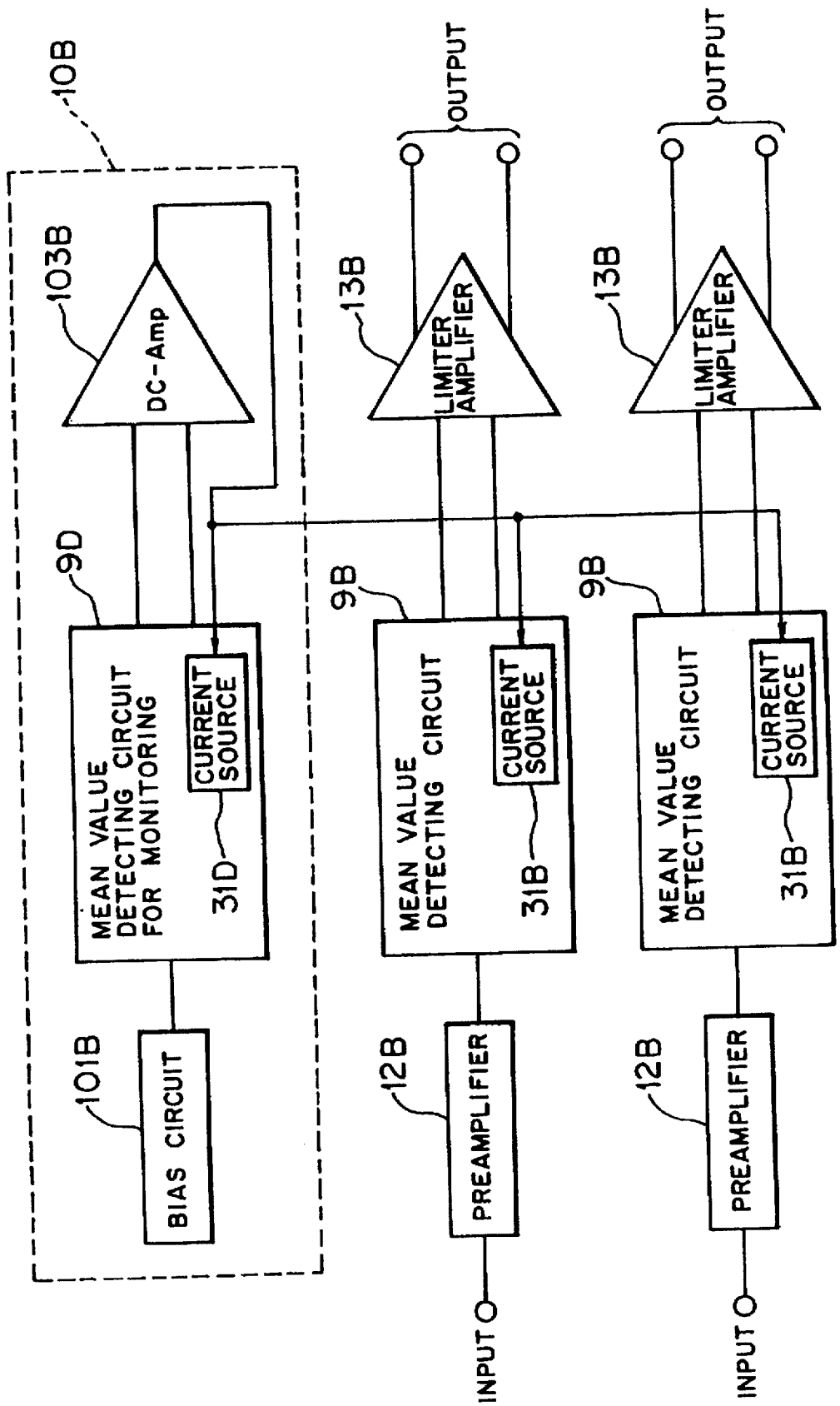
FIG. 19 is a block diagram showing another structure of the mean value detecting apparatus according to the second embodiment of this invention.

FIG. 19 is a diagram showing a structure of a mean value detecting apparatus in which circuits (circuit units) each made up of the preamplifier 12B, the mean value detecting circuit 9B and the limiter amplifier 13B having been described with reference to FIG. 17 are provided for two channels, and the monitor circuit 10B is used in common. The structures and operations of the parts of the mean value detecting circuit shown in FIG. 19 have been described with reference to each of FIGS. 17 and 18, no description of which is made here.

In the mean value detecting apparatus with the above structure, the monitor circuit 10B used commonly to the two channels may cancel a potential difference generated due to a leak current by using a feedback signal of the monitor circuit 10B in common to the channels, as having been stated with reference to the respective FIGS. 17 and 18. The monitor circuit 10B may be used commonly to a plurality of channels although the monitor circuit 10B is in common to the two channels in the above mean value detecting apparatus.

If the bias circuit 101B in the common monitor circuit 10B above-mentioned is formed with the same circuit as the preamplifiers 12B provided for two channels, it is possible to effectively cancel a potential difference due to the leak current.

As above, there is provided the monitor circuit 10B in common to the channels in the mean value detecting apparatus shown in FIG. 19 so that it is possible to limit a size of the circuit of the mean value detecting apparatus formed with a circuit made up of the preamplifiers 12B, the mean value detecting circuits 9B and the limiter amplifiers 13B for the plural channels to a minimum.

Figure 20:
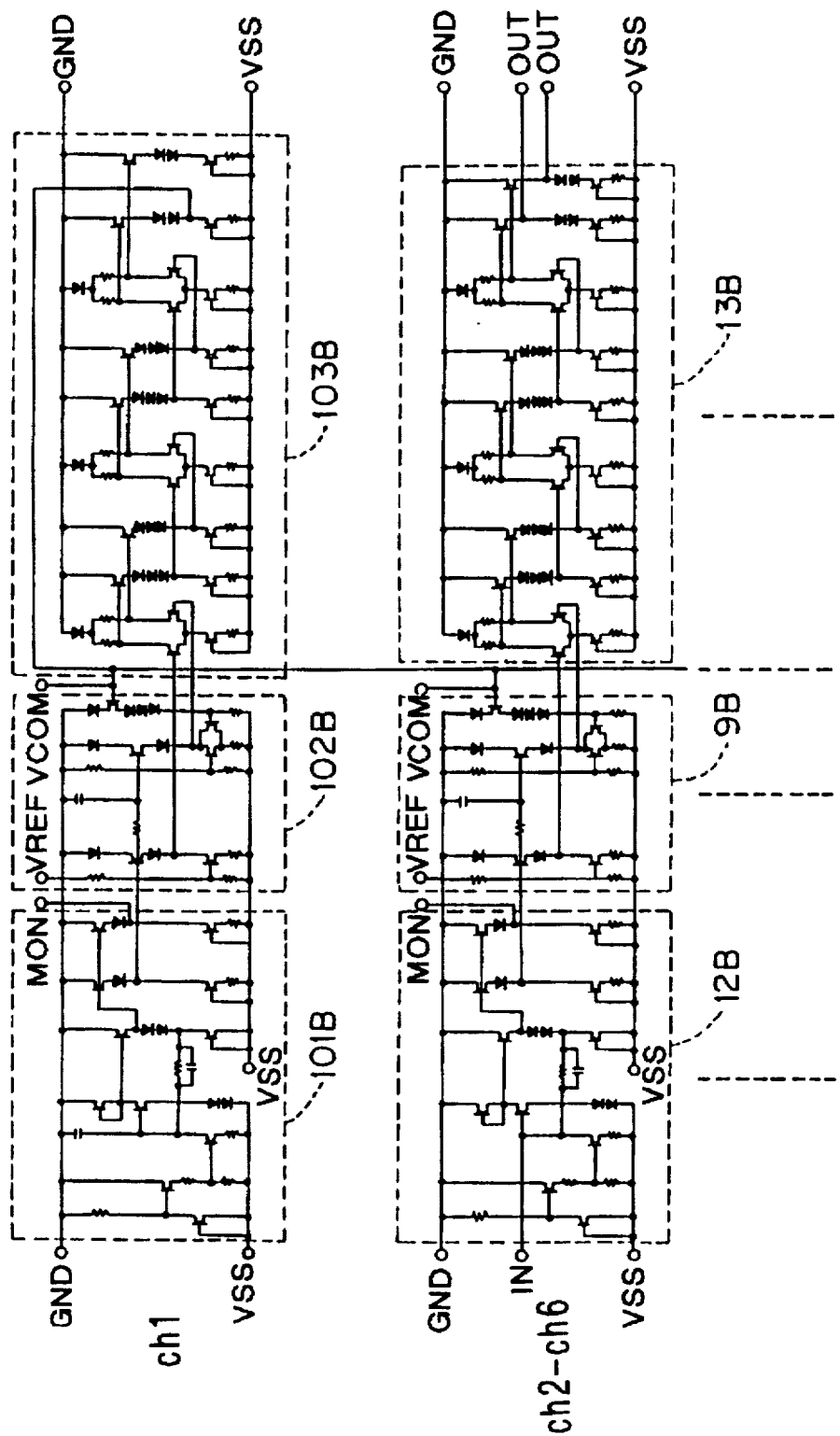
FIG. 20 shows an example of the mean value detecting apparatus according to the second embodiment of this invention whose essential part is formed with practical circuits.

FIG. 20 is a block diagram showing an example of a mean value detecting apparatus formed with practical circuits in which circuits each made up of a preamplifier 12B, a mean value detecting circuit 9B and a limiter amplifier 13B are provided for plural channels (5 channels: ch 2 to ch 6, for example), and a monitor circuit 10B is provided commonly to the plural channels.

(d) Description of Third Embodiment of this Invention

Next description will be made of a third embodiment of this invention.

Figure 21:
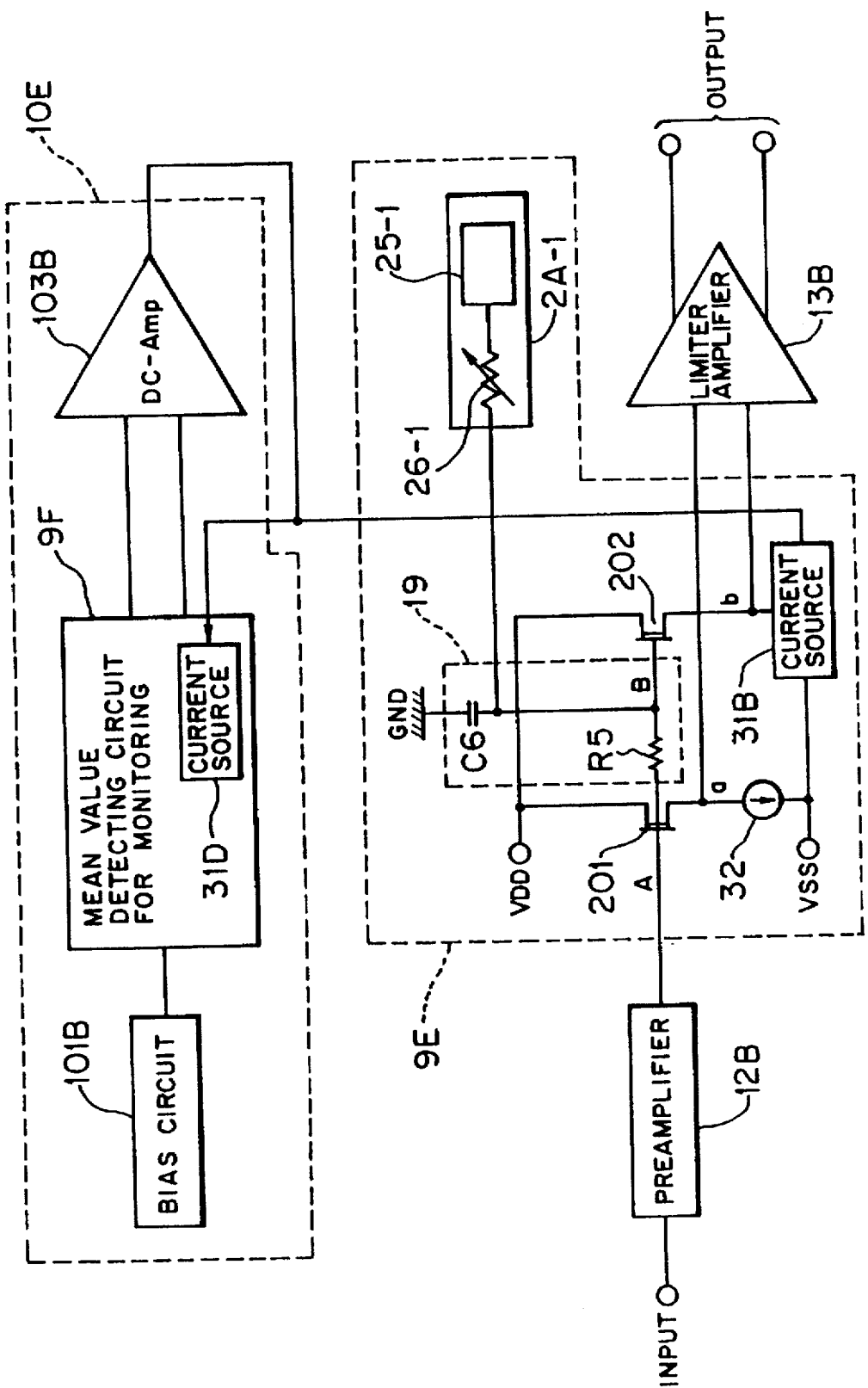
FIG. 21 is a block diagram showing a structure of a mean value detecting apparatus according to a third embodiment of this invention.
Figure 23:
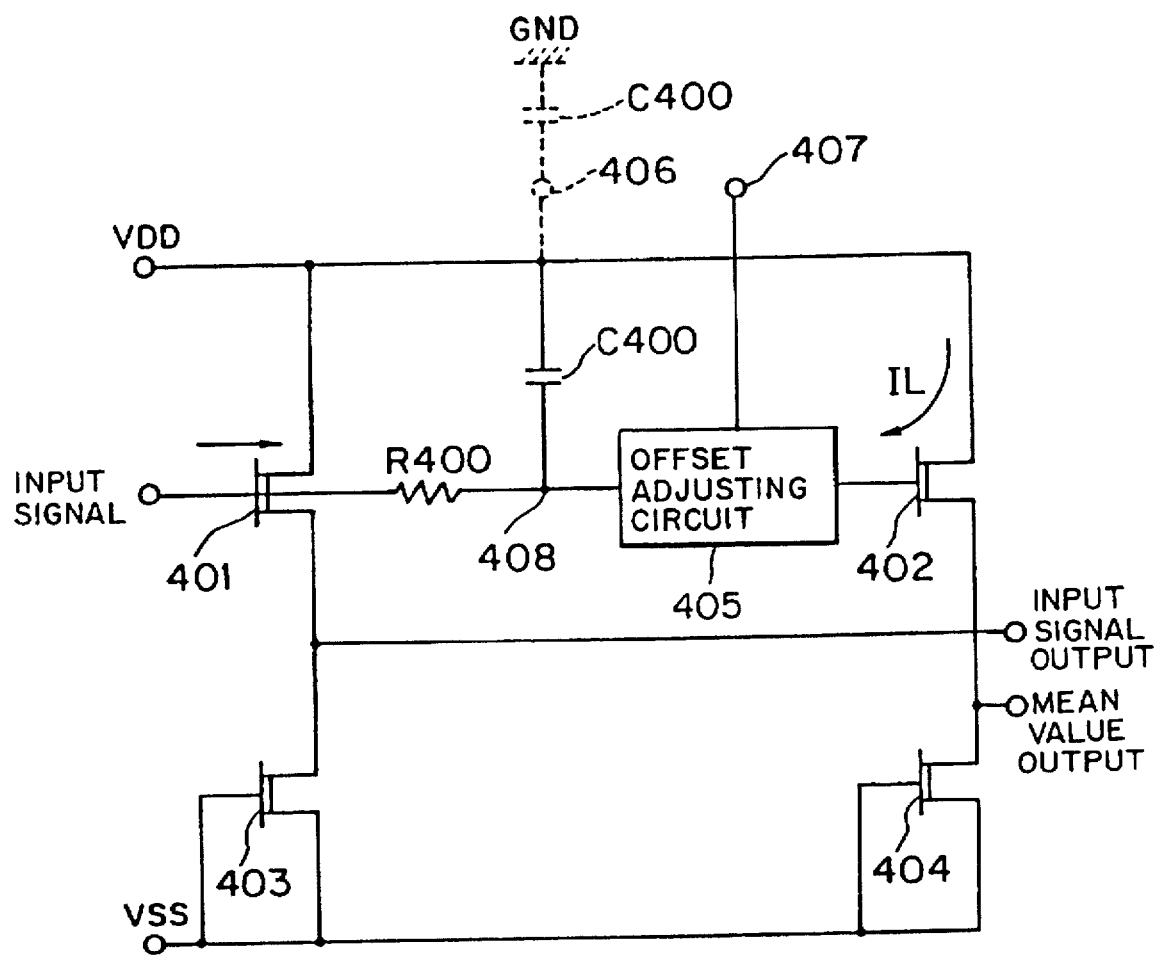
FIG. 23 is a diagram showing a general mean value detecting apparatus.

FIG. 21 is a diagram showing a structure of a mean value detecting apparatus as a third embodiment of this invention. The mean value detecting apparatus shown in FIG. 21 is, in brief, a combination of the mean value detecting circuit (apparatus) according to the first embodiment and the mean value detecting apparatus according to the second embodiment.

Namely, the apparatus shown in FIG. 21 has a preamplifier 12B, a mean value detecting circuit 9E and a limiter amplifier 13B. A preamplifier 12B and the limiter amplifier 13B are the same as those in the second embodiment, no description of which is thus made here.

The mean value detecting circuit 9E has a mean value detecting unit 19, an offset voltage adjusting circuit 2A-1, an FET 201 (a first source follower circuit using a first FET), and an FET 202 (a second source follower circuit using a second FET). A current source (a control circuit) 31B is connected to a source of the FET 202.

The mean value detecting unit 19 has a resistor R5 for detecting a mean value of an output (an input signal) of the preamplifier 12B and a capacitor (a capacitance) C6. The offset voltage adjusting circuit 2A-1 formed with a series connection of a variable resistor 26-1 and a power source 25-1 is connected in parallel to the mean value detecting unit 19 at a connecting point between the resistor R5 and the capacitor C6 in the mean value detecting unit 19.

The mean value detecting apparatus shown in FIG. 21 includes a monitor circuit 10E for cancelling a potential difference $\Delta V3$ generated in the resistor R5 due to a leak current from the FET 202. The monitor circuit 10E has a bias circuit 101B and a DC amplifier (a DC-Amp) 103B similar to those in the second embodiment along with a mean value detecting circuit for monitoring 9F having the same structure as the above mean value detecting circuit 9E.

In the mean value detecting apparatus having the above structure, a potential difference being generated between an input signal and an output of a mean value due to a leak current from the FET in the mean value detecting circuit 9E may be adjusted by the offset voltage adjusting circuit 2A-1, as stated in the second embodiment. In addition, it is possible to cancel a potential error being generated between the input signal and the output of the mean value by controlling current values of the current sources 31D and 31B by using deviation information that is a feedback signal from the DC amplifier 103B in the monitor circuit 10E, as having been stated in the second embodiment.

In other words, according to the mean value detecting apparatus shown in FIG. 21, a combination of the mean value detecting apparatus (circuits) having been described in the first and second embodiments, respectively, may regulate double an offset (a potential error) between the input signal and the mean value output signal by using the offset voltage adjusting circuit 2A-1 and using a potential difference (deviation information) that are feedback signals from the DC amplifier in the monitor circuit 10E so that a performance of the mean value detecting apparatus may be largely improved.

(e) Others

In the above embodiment, each of the mean value detecting circuits has a structure shown, for example, in FIG. 14. It is alternatively possible to employ another circuit equivalent to the above mean value detecting circuit. In which case, the same function and effect will be brought. In practice, a circuit as shown in FIG. 22 may be employed as a circuit equivalent to the mean value detecting circuit shown in FIG. 14. In this case, an FET 110 (a first FET), an FET 111 and a resistor R3 form a first source follower circuit, while FET 112 (a second FET), an FET 113 and a resistor R4 form a second source follower circuit.

What is claimed is:

1. A mean value detecting apparatus comprising:
    a mean vague detecting unit having a resistance and a capacitance in order to produce a mead value signal from an input signal;
    an offset voltage adjusting unit connected to said mean value detecting unit at a connecting point between said resistance and said capacitance;
    wherein said offset forcibly generating unit includes a first source follower circuit using a first FET and a second source follower circuit using a second FET; and
    threshold voltages and currents of said first FET and said second FET are both set to the same values, and said first FET and said second FET have different gate widths in order to forcibly generate an offset between the input signal and the mean value signal.

2. The mean value detecting apparatus according to claim 1, wherein a gate width of said first FET is wider than a gate width of said second FET so that the input signal has a higher potential than the mean value output signal.

3. The mean value detecting apparatus according to claim 1, wherein a gate width of said first FET are set wider than a gate width of said second FET so that the input signal has a lower potential than the mean value output signal.

4. The mean value detecting apparatus according to claim 1, wherein said offset forcibly generating unit is configured so that the input signal has a higher potential than the mean value signal.

5. The mean value detecting apparatus according to claim 1, wherein said offset forcibly generating unit is configured so that the input signal has a lower potential than the mean value signal.

6. A mean value detecting apparatus comprising:
    a mean value detecting unit having a resistance and a capacitance in order to produce a mean value signal from an input signal;
    an offset voltage adjusting unit connected to said mean value detecting unit at a connecting point between said resistance and said capacitance;
    an offset forcibly generating unit for forcibly generating an offset between said mean value signal and said input signal;
    wherein said offset forcibly generating unit includes a first source follower circuit using a first FET and a second source follower circuit using a second FET, a first constant-current source is connected to a source of said first FET via a first diode formed with an FET, while second constant-current source is connected to a source of said second FET via a second diode formed with an FET;
    threshold voltages and gate widths of said first FET and said second FET are set to the same value, respectively, besides currents of said constant-current sources are set to the same value; and
    a gate width of said first diode and a gate width of said second diode are set to different widths in order to forcibly generate an offset between the input signal and the mean value signal.

7. The mean value detecting apparatus according to claim 6, wherein a gate width of said first diode is greater than a gate width of said second diode so that the input signal has a higher potential than the mean value output signal.

8. The mean value detecting apparatus according to claim 6, wherein a gate width of said second diode is set wider than a gate width of said first diode so that the input signal has a lower potential than the mean value output signal.

9. A mean value detecting apparatus comprising:
    a mean value detecting unit having a resistance and a capacitance in order to produce a mean value signal from an input signal;
    an offset voltage adjusting unit connected to said mean value detecting unit at a connecting point between said resistance and said capacitance;
    an offset forcibly generating unit for forcibly generating an offset between said mean value signal and said input signal;
    wherein said offset forcibly generating unit includes a first source follower circuit using a first FET and a second source follower circuit using a second FET, a first current source is connected to a source of said first FET, while a second current source is connected to a source of second FET;
    threshold voltages and gate widths of said first FET and said second FET are set to the same value, respectively; and
    a current value of said first current source and a current value of said second current source are set to different values in order to forcibly generate an offset between the input signal and the mean value signal.

10. The mean value detecting apparatus according to claim 9, wherein the current value of said second current source is larger than the current value of said first current source so that the input signal has a higher potential than the mean value output signal.

11. The mean value detecting apparatus according to claim 9, the current value of said first current source is set larger than the current value of said second current source so that the input signal has a lower potential than the mean value output signal.

12. The mean value detecting apparatus according to claim 10, wherein said first current source is formed with a third FET and a first resistance connected to a source of said third FET, while second current source is formed with a fourth FET and a second resistance connected to a source of said fourth FET, and a gate width of said fourth FET are set N times (where N is a value of said first resistance/a value of said second resistance) a gate width of said third FET so that the input signal has a higher potential than the mean value output signal.

13. The mean value detecting apparatus according to claim 11, wherein said first current source is formed with a third FET and a first resistance connected to a source of said third FET, while second current source is formed with a fourth FET and a second resistance connected to a source of said fourth FET, and a gate width of said third FET are set N times (where N is a value of said first resistance/a value of said second resistance) a gate width of said fourth FET so that the input signal has a lower potential than the mean value output signal.

14. The mean value detecting apparatus according to claim 10, wherein said first current source is formed with a third FET and a first resistance connected to a source of said third FET, while said second current source is formed with a fourth FET and a second resistance connected to a source of said fourth FET, and a value of said first resistance is set to a larger value than a value of said second resistance so that the input signal has a higher potential than the mean value output signal.

15. The mean value detecting apparatus according to claim 11, wherein said first current source is formed with a third FET and a first resistance connected to a source of said third FET, while said second current source is formed with a fourth FET and a second resistance connected to a source of said fourth FET, and a value of said second resistance is set to a larger value than a value of said first resistance so that the input signal has a lower potential than the mean value output signal.

16. The mean value detecting apparatus according to claim 10, wherein said first current source is formed with a third FET, while said second current source is formed with a fourth FET, and a gate potential of said fourth FET is set to a higher potential than a gate potential of said third FET so that the input signal has a higher potential than the mean value output signal.

17. The mean value detecting apparatus according to claim 11, wherein said first current source is formed with a third FET, while said second current source is formed with a fourth FET, and a gate potential of said third FET is set to a higher potential than a gate potential of said fourth FET so that the input signal has a lower potential than the mean value output signal.

18. A mean value detecting apparatus comprising:
a mean value detecting unit having a resistance and a capacitance in order to produce a mean value signal from an input signal;
an offset voltage adjusting unit connected to said mean value detecting unit at a connecting point between said resistance and said capacitance;
a compensating circuit connected to an input side of said mean value detecting unit for processing the input signal; and
said compensating circuit being connected to said mean value detecting unit via a resistance at a connecting point of said resistance and said capacitance in said mean value detecting unit.

19. A mean value detecting integrated circuit comprising:
a plurality of circuit units, wherein each of said circuit units comprises:
a front stage circuit for processing an input signal;
a mean value detecting unit for producing a mean value signal of an output of said front-stage circuit, said mean value detecting unit including a resistor and capacitor;
a rear stage circuit for processing said mean value signal from said mean value detecting unit; and
a strip line being formed in a direction intersecting an input-output direction of each of said circuit units, a connecting terminal for connecting said capacitor and an offset voltage adjusting unit to an end of said strip line.

20. The mean value detecting integrated circuit according to claim 19, wherein said offset voltage adjusting unit includes a voltage source and a resistor.

21. A mean value detecting integrated circuit comprising:
a plurality of circuit units wherein each circuit unit includes:
a front stage circuit for processing an input signal;
a mean vague detecting unit for producing a mean value signal of an output of said front stage circuit, said mean value detecting unit including a resistor and a capacitor;
a rear stage circuit for processing said mean value signal of said mean value detecting unit;
a strip line formed in a direction intersecting an input-output direction of each said circuit unit, a connecting terminal for connecting said capacitor and an offset voltage adjusting unit to an end of said strip line;
a compensating circuit having the same temperature, source voltage fluctuation characteristic as said front stage circuits; and
an output terminal for outputting an output from said compensating circuit and input terminals each provided at an end of each of said strip lines and connected to said output terminal for said compensating circuit for receiving an output from said compensating circuit.

22. A mean value detecting integrated circuit comprising:
a plurality of circuit units wherein each circuit unit includes:
a front stage circuit for processing an input signal;
a mean value detecting unit for producing a mean value signal of an output of said front stage circuit, said mean value detecting unit including a resistor and a capacitor;
a rear stage circuit for processing said mean value signal of said mean value detecting unit;
a strip line formed in a direction intersecting an input-output direction of each said circuit unit, a connecting terminal for connecting said capacitor and an offset voltage adjusting unit to an end of said strip line; and
wherein said front stage circuit is formed as a preamplifier, and said rear stage circuit is formed as a differential amplifier for receiving an output of said preamplifier and an output of said mean value detecting unit as differential inputs.

23. A mean value detecting apparatus comprising:
a mean value detecting circuit comprising:
a mean value detecting unit includes a resistance and a capacitance for detecting a mean value of an input signal;

a first source follower circuit using a first FET;

a second source follower circuit using a second FET;

a monitor circuit for cancelling a potential difference caused by a leak current from said second FET of said second source follower circuit, said monitor circuit comprising:

a bias circuit;

a mean value detecting circuit for monitoring and receiving output signals from said bias circuit, having the same structure as said mean value detecting circuit;

a comparing circuit of a direct-current amplifier type for comparing an input signal with an output signal of said mean value detecting circuit for monitoring to feed back deviation information as a feedback signal to said mean value detecting circuit for monitoring; and a control circuit for controlling a source follower current of said second source follower circuit by using the deviation information as the feedback signal of said monitor circuit.

24. A mean value detecting apparatus comprising:

a pre-circuit for performing a necessary process on an input signal;

a mean value detecting circuit comprising:

a mean value detecting unit formed with a resistance and a capacitance for detecting a mean value of an output of said pre-circuit;

a first source follower circuit using a first FET;

a second source follower circuit using a second FET;

a differential amplifier circuit for receiving an output of said pre-circuit and an output of said mean value detecting circuit as differential inputs;

a monitor circuit for differing a potential difference caused by a leak current from said second FET of said second source follower circuit in said mean value detecting circuit, said monitor circuit comprising;

a bias circuit;

a mean value detecting circuit for monitoring for receiving an output of said bias circuit as an input signal, having the same structure as said mean value detecting circuit;

a comparing circuit of a direct-current amplifier type for comparing an input signal and an output signal of said mean value detecting circuit for monitoring to feed back deviation information as a feedback signal to said mean value detecting circuit for monitoring; and a control circuit for controlling a source follower current of said second source follower circuit by using said deviation information as the feedback signal of said monitor circuit to cancel a potential difference being generated due to said leak current at an input point of said differential amplifier circuit.

25. The mean value detecting apparatus according to claim 24, wherein said bias circuit is formed as a circuit having the same temperature, source voltage fluctuation characteristic as said pre-circuit.

26. The mean value detecting apparatus according to claim 24, wherein said bias circuit is formed as the same circuit as said pre-circuit.

27. A mean value detecting apparatus comprising:

a plurality of circuit units each of said circuit units comprising:

a pre-circuit for processing an input signal;

a mean value detecting circuit comprising:

a mean value detecting unit formed with a resistance and a capacitance for detecting a mean value of an output of an output of said pre-circuit;

a first source follower circuit using a first FET;

a second source follower circuit using a second FET;

a differential amplifier circuit for receiving an output of said pre-circuit and an output of said mean value detecting circuit as differential inputs;

a monitor circuit for cancelling a potential difference caused by a leak current from said second FET of said second source follower circuit in said mean value detecting circuit, said monitor circuit comprising:

a bias circuit;

a second mean value detecting circuit for monitoring and receiving an output from said bias circuit as an input signal, having the same structure as said mean value detecting circuit;

a comparing circuit of a direct-current amplifier type for comparing an input signal and an output signal of said second mean value detecting circuit for monitoring to feed back deviation information as a feedback signal to said mean value detecting circuit for monitoring; and control circuits provided for said plurality of circuit units, each of said control circuits for controlling a source follower current of said second source follower circuit by using the deviation information as the feedback signal of said monitor circuit to cancel a potential difference caused by said leak current at an input point of each of said differential amplifier circuits.

28. The mean value detecting apparatus according to claim 27, wherein said common bias circuit is formed as the same circuit as each of said pre-circuits.

29. A mean value detecting apparatus comprising:

a mean value detecting circuit comprising:

a mean value detecting unit formed with a resistance and a capacitance for detecting a mean value of an input signal;

an offset voltage adjusting unit connected in parallel to said mean value detecting unit at a connecting point of said resistance and said capacitance in said mean value detecting unit;

a first source follower circuit using a first FET;

a second source follower circuit using a second FET;

a monitor circuit for cancelling a potential difference caused by a leak current from said second FET in said second source follower circuit, said monitor circuit comprising;

a bias circuit;

a mean value detecting circuit for monitoring for receiving output signals from said bias circuit, said mean value detecting circuit for monitoring having the same structure of said mean value detecting circuit;

a comparing circuit of a direct-current amplifier type for comparing an input signal and an output signal of said mean value detecting circuit for monitoring to feed back deviation information as a feedback signal to said mean value detecting circuit for monitoring; and a control circuit for controlling a source follower current of said second source follower circuit by using the deviation information as the feedback signal of said monitor circuit.

* * * * *